United States Patent
Ahlers et al.

(10) Patent No.: US 10,291,108 B2
(45) Date of Patent: May 14, 2019

(54) RECTIFYING DEVICES AND RECTIFIER ARRANGEMENTS

(71) Applicant: Infineon Technologies AG, Neubiberg (DE)

(72) Inventors: Dirk Ahlers, Munich (DE); Frank Auer, Roehrmoos (DE); Herbert Gietler, Villach (AT); Michael Lenz, Zorneding (DE)

(73) Assignee: Infineon Technologies AG, Neubiberg (DE)

( * ) Notice: Subject to any disclaimer, the term of this patent is extended or adjusted under 35 U.S.C. 154(b) by 818 days.

(21) Appl. No.: 14/849,655

(22) Filed: Sep. 10, 2015

(65) Prior Publication Data

US 2016/0072376 A1 Mar. 10, 2016

(30) Foreign Application Priority Data

Sep. 10, 2014 (DE) .......................... 10 2014 113 035

(51) Int. Cl.
*H02M 1/08* (2006.01)
*H01L 27/02* (2006.01)
(Continued)

(52) U.S. Cl.
CPC .......... *H02M 1/08* (2013.01); *H01L 27/0207* (2013.01); *H01L 27/0733* (2013.01);
(Continued)

(58) Field of Classification Search
CPC ........ H02M 1/08; H02M 7/217; H02M 7/219; H02M 2001/0048; H02M 2007/2195;
(Continued)

(56) References Cited

U.S. PATENT DOCUMENTS 4,056,157 A * 11/1977 Kawata ................ B60K 31/105
123/352
7,714,544 B2 * 5/2010 Bolz ....................... B60R 16/03
320/166
(Continued)

FOREIGN PATENT DOCUMENTS

DE 69606899 T2 6/2000
DE 102005010013 A1 9/2006
(Continued)

OTHER PUBLICATIONS

Lee, Hyung-Min et al., "An Integrated Power-Efficient Active Rectifier With Offset-Controlled High Speed Comparators for Inductively Powered Applications", IEEE Transactions on Circuits and Systems—I: Regular Papers, vol. 58, No. 8, Aug. 2011, pp. 1749-1760.
(Continued)

*Primary Examiner* — Matthew V Nguyen
(74) *Attorney, Agent, or Firm* — Murphy, Bilak & Homiller, PLLC

(57) ABSTRACT

A rectifying device includes a power transistor, a gate control circuit and a capacitor structure arranged on a single semiconductor die. The power transistor includes a source or emitter terminal connected to a first terminal of the rectifying device, a drain or collector terminal connected to a second terminal of the rectifying device, and a gate. The gate control circuit is operable to control a gate voltage at the gate of the power transistor based on at least one parameter relating to at least one of a voltage and a current between the first terminal and the second terminal.

20 Claims, 15 Drawing Sheets

(51) Int. Cl.
   *H01L 27/07* (2006.01)
   *H02K 11/04* (2016.01)
   *H02M 7/217* (2006.01)
   *H02M 7/219* (2006.01)
   *H02M 1/00* (2006.01)

(52) U.S. Cl.
   CPC .......... *H02K 11/046* (2013.01); *H02M 7/217* (2013.01); *H02M 7/219* (2013.01); *H02M 2001/0048* (2013.01); *H02M 2007/2195* (2013.01); *Y02B 70/1408* (2013.01)

(58) Field of Classification Search
   CPC . H01L 27/0207; H01L 21/0733; H02K 11/04; H02K 11/046; Y02B 70/1408
   See application file for complete search history.

(56) References Cited

U.S. PATENT DOCUMENTS

| | | | |
|---|---|---|---|
| 8,350,378 | B2 | 1/2013 | Spitz et al. |
| 8,735,957 | B2 | 5/2014 | Rutter |
| 9,064,713 | B2 | 6/2015 | Lenz |
| 2002/0141214 | A1 | 10/2002 | Grover |
| 2004/0164785 | A1 | 8/2004 | Metzler |
| 2004/0222484 | A1 | 11/2004 | Saxelby et al. |
| 2005/0218489 | A1 | 10/2005 | Satou et al. |
| 2012/0306300 | A1* | 12/2012 | Ishikawa ............. H02K 11/048 310/62 |
| 2013/0043527 | A1 | 2/2013 | Lui et al. |

FOREIGN PATENT DOCUMENTS

| | | |
|---|---|---|
| DE | 19882461 B3 | 5/2012 |
| DE | 102013109650 A1 | 3/2014 |
| EP | 0736959 A1 | 10/1996 |
| EP | 2128984 A1 | 12/2009 |
| JP | S57059475 A | 4/1982 |
| JP | H08336268 A | 12/1996 |
| JP | H11164538 A | 6/1999 |
| JP | 2002136075 A | 5/2002 |
| JP | 2003116279 A | 4/2003 |
| JP | 2006502690 A | 1/2006 |
| JP | 2008187167 A | 8/2008 |
| JP | 2009515356 A | 4/2009 |
| JP | 2011029499 A | 2/2011 |
| JP | 2011061928 A | 3/2011 |
| JP | 2012256862 A | 12/2012 |
| JP | 2013089764 A | 5/2013 |
| JP | 2014054173 A | 3/2014 |
| TW | 201246534 | 11/2012 |
| TW | 201310604 A | 3/2013 |
| TW | I434412 B | 4/2014 |
| WO | 9854827 A1 | 12/1998 |

OTHER PUBLICATIONS

Lim, Chow Yee et al., "A Smart-Power Synchronous Rectifier by CMOS Process", IEEE Transactions on Power Electronics, vol. 25, No. 9, Sep. 2010, pp. 2469-2477.

Disney, Don, "Review of Silicon Power Semiconductor Technologies for Power Supply on Chip and Power Supply in Package Applications", IEEE Transactions on Power Electronics, Institute of Electrical and Electronics Engineers, USA, vol. 28, No. 9, Sep. 1, 2013, pp. 4168-4181.

Ma, Kui et al., "A semi-Insulation Structure for Integrating Vertical DMOS in Smart Power Integrated Circuits", IEEE International Conference of IEEE Region 10 (TENCON 2013), IEEE, Oct. 22, 2013, pp. 1-3.

* cited by examiner

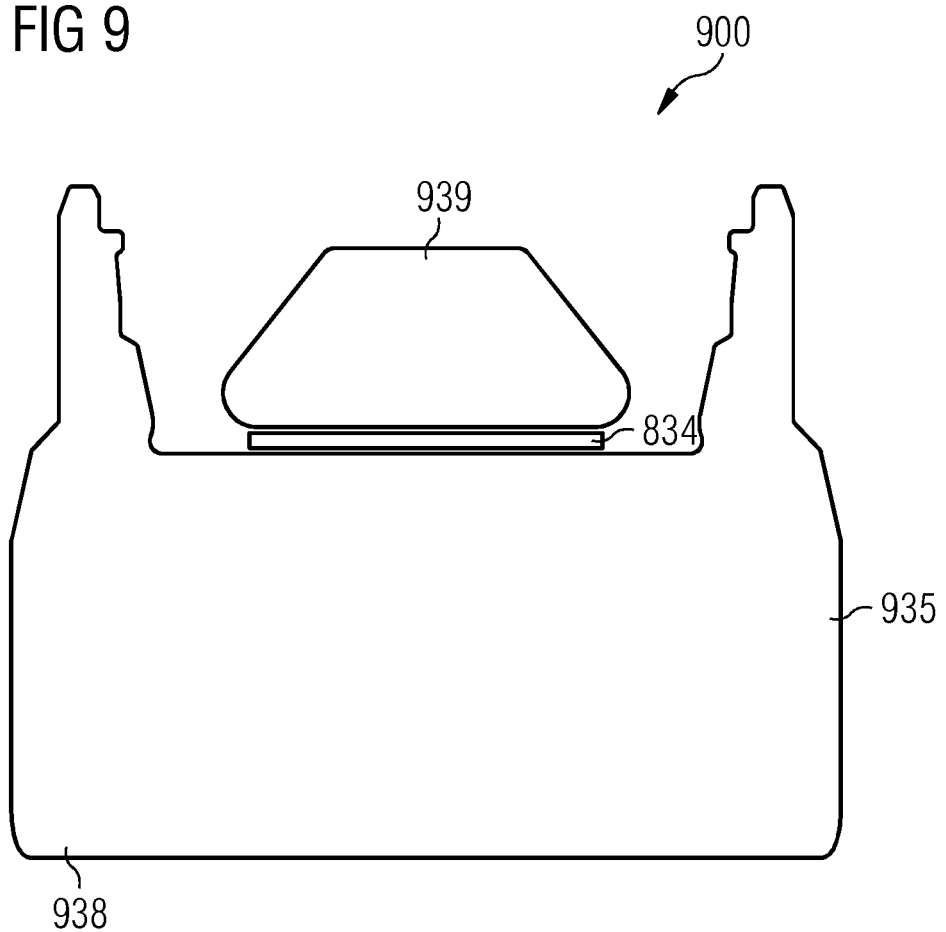

RECTIFYING DEVICES AND RECTIFIER ARRANGEMENTS

PRIORITY CLAIM

This application claims priority to German Patent Application No. 10 2014 113 035.9 filed on 10 Sep. 2014, the content of said application incorporated herein by reference in its entirety.

TECHNICAL FIELD

Embodiments relate to signal rectification and in particular to rectifying devices and rectifier arrangements.

BACKGROUND

Rectification of signals (e.g. current signals) in generators may be achieved through p-n diodes and at least two may be needed per phase (for positive and negative half-waves). As p-n diodes may have a voltage drop Vf in a forward direction from about 0.9 V to 1 V, currents in a generator may reach or exceed 100 A and electrical losses up to and exceeding 100 to 200 W may be experienced. In large automotive generators, 6 phase generators may be used due to power loss, for example. At moderate cooling, two diodes may be used respectively, e.g. in parallel, to reduce forward current, transmission power and temperature threshold limits to a tolerable level. The high losses of the p-n diodes may cause problems related to the efficiency of the generators and to carbon dioxide ($CO_2$) balance.

SUMMARY

Some embodiments relate to a rectifying device. The rectifying device includes a power transistor and a gate control circuit and a capacitor structure arranged on a single semiconductor die. The power transistor includes a source or emitter terminal connected to a first terminal of the rectifying device, a drain or collector terminal connected to a second terminal of the rectifying device, and a gate. The gate control circuit is operable to control a gate voltage at the gate of the power transistor based on at least one parameter relating to at least one of a voltage and a current between the first terminal and the second terminal.

Some embodiments relate to a rectifier arrangement or press-fit rectifying device.

The press-fit rectifying device comprises a semiconductor die and a two-terminal press-fit package comprising a first terminal and a second terminal. The semiconductor die comprises a power transistor having a source terminal connected to the first terminal of the rectifying device, a drain terminal connected to the second terminal of the rectifying device and a gate. The semiconductor die further includes a gate control circuit operable to control a gate voltage at the gate of the power transistor based on at least one parameter relating to at least one of a voltage and a current between the first terminal and the second terminal.

Some embodiments relate to an electric generator for a motor vehicle. The electric generator comprises a semiconductor die with a power transistor having a source terminal connected to the first terminal of the rectifying device, a drain terminal connected to the second terminal of the rectifying device and a gate. The semiconductor die further includes a gate control circuit operable to control a gate voltage at the gate of the power transistor based on at least one parameter relating to at least one of a voltage and a current between the first terminal and the second terminal.

The rectifier arrangement includes a rectifying device and a housing enclosing the rectifying device. The rectifying device includes a rectifier transistor and a rectifier control circuit formed on a common semiconductor die. The rectifier transistor includes a source or emitter terminal, a drain or collector terminal and a gate or base terminal. An input terminal of the rectifying device is coupled to the source or emitter terminal of the rectifier transistor. An output terminal of the rectifying device is coupled to the drain or collector terminal of the rectifier transistor. The gate or base terminal of the rectifier transistor is coupled to the rectifier control circuit. The housing comprises a first externally accessible terminal connected to the input terminal of the rectifying device and a second externally accessible terminal connected to the output terminal of the rectifying device.

BRIEF DESCRIPTION OF THE FIGURES

Some embodiments of apparatuses and/or methods will be described in the following by way of example only, and with reference to the accompanying figures, in which:

FIG. 9 shows a further rectifier arrangement including a rectifying device and a housing;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
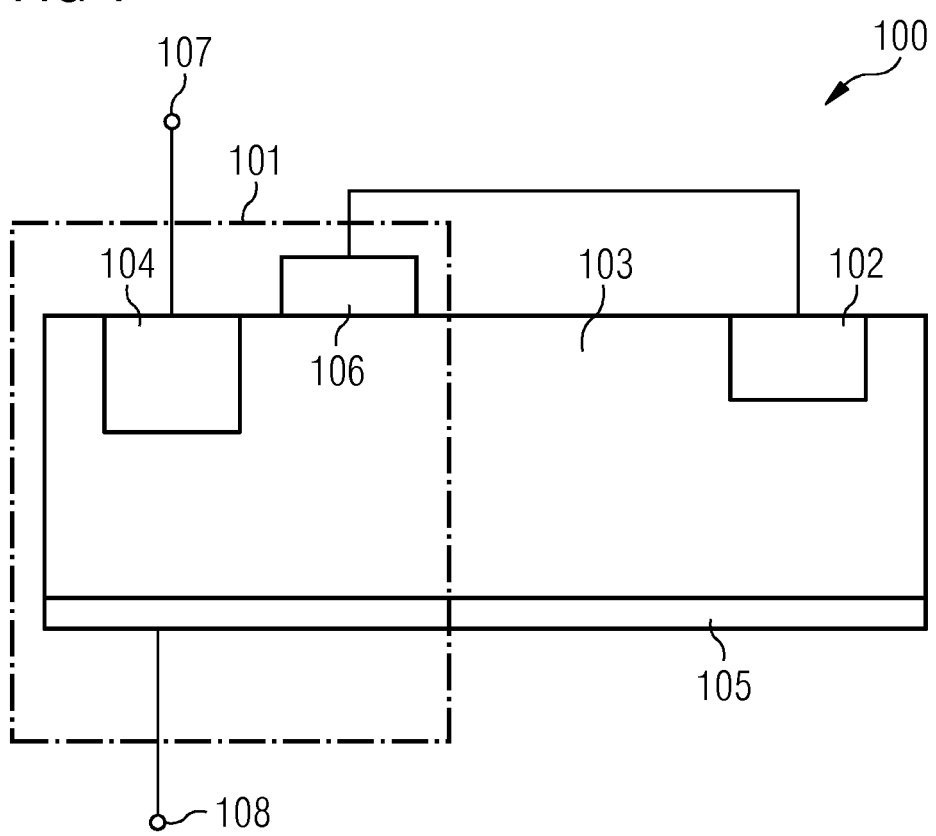
FIG. 1 shows a schematic illustration of a rectifying device.

FIG. 1 shows a schematic illustration of a rectifying device 100 according to an embodiment.

The rectifying device 100 includes a power transistor, also termed rectifier transistor 101 herein and a rectifier control circuit or gate control circuit 102 formed on a common or single semiconductor die or chip 103. The power transistor 101 includes a source or emitter terminal 104, a drain or collector terminal 105 and a gate or base terminal 106. The gate or base terminal is not an external terminal. An input terminal 107 of the rectifying device 100 is coupled to the source or emitter terminal 104 of the rectifier transistor 101. An output terminal 108 of the rectifying device 100 is coupled to the drain or collector terminal 105 of the rectifier transistor 101. The gate or base terminal 106 of the rectifier transistor 101 is coupled to the rectifier control circuit 102. The coupling may be in a metal layer of the semiconductor chip or die and no external bonding is required.

Due to the formation of a rectifier control circuit for controlling the gate of a power transistor and the power transistor on a common semiconductor die, no further external control or supply circuit may be needed to operate the rectifying device. By using a power transistor for rectifying an oscillating signal, the power loss of the rectifying device may be reduced, for example. The power transistor may therefore be termed rectifier transistor. Furthermore, a rectifying device with only two externally accessible terminals may be housed or packaged in a two-terminal housing having improved thermal properties, resulting in reduced power losses, for example. For example a press-fit package commonly used for diode rectifiers, for example in automotive applications, may be used with the rectifier device of the present disclosure.

Further, a monolithic integration of the rectifier transistor may result in reduced costs, for example.

The rectifying device 100 may be implemented on a common (or single) semiconductor die or semiconductor chip. For example, the rectifier transistor 101 and the rectifier control circuit 102 may be formed on or in the same semiconductor die or chip. The semiconductor die may include part of a semiconductor substrate or wafer. The semiconductor substrate or wafer may be a silicon-based semiconductor substrate, or silicon carbide-based semiconductor substrate, or gallium arsenide-based semiconductor substrate or gallium nitride-based semiconductor substrate, for example.

The rectifying device 100 may be a device used for rectifying an alternating signal, for example. The rectifying device 100 may be implemented in or connected to a generator circuit or an alternator circuit, for example. For example, the rectifying device 100 may be connected to an automotive generator circuit or alternator circuit. The alternator circuit may be an alternating current generator or a multi-phase circuit, for example, a 3-phase or a 6-phase alternator circuit. One or more rectifying devices 100 may be connected to a circuit pathway of one pre-determined phase of an alternating signal of the multi-phase alternator circuit to receive the alternating signal, for example. For example, a single rectifying device connected to a circuit pathway of an alternating signal may be used for half-wave rectification of the alternating signal. For example, a pair of rectifying devices connected in reverse polarity with respect to each other and connected to the circuit pathway of the alternating signal may be used for full-wave rectification of the alternating signal. Such a plurality of rectifying devices or a plurality of rectifying transistors for rectifying the output current or voltage may be implemented on a common semiconductor die, for example.

The rectifying device 100 may be configured to receive an input alternating signal via its input terminal 107, for example. The rectifying device 100 may rectify the alternating signal, for example. For example, the rectifying device 100 may be configured to produce a rectified output signal at the output terminal 108 of the rectifying device 100, for example. For example, the rectifying device 100 may be configured to produce a rectified output signal at the output terminal 108 of the rectifying device 100 based on the input signal received at the input terminal 107 of the rectifying device 100, for example. The input signal may alternate between a first input signal level and a second input signal level, for example. For example, the rectifier transistor 101 of the rectifying device 100 may be configured to rectify the alternating signal by operating alternatingly in a transistor on-state or a transistor off-state, e.g. by switching between a transistor on-state (conducting state) and a transistor off-state (blocking state).

For example, the rectifier control circuit 102 may be configured to switch the rectifier transistor between the transistor on-state and the transistor off-state. The rectifier control circuit 102 may include a central control circuit of the rectifying device, for example. The rectifier control circuit 102 may include a switching control circuit which may be configured to generate a control signal having a first output state or a second output state. The rectifier control circuit 102 may be configured to switch the rectifier transistor 101 to the transistor on-state based on the control signal having a first output state and to switch the rectifier transistor 101 to a transistor off-state based on the control signal having a second output state. The switching control signal may be configured to generate the control signal based on a determination of at least one parameter value associated with the rectifying device 100. For example, the at least one parameter value may be a current value, a voltage value, a zero-crossing value, a temperature value, a frequency value, a current-voltage slope, a conduction angle a duty cycle value, or a combination thereof.

Based on an output state of the control signal, the rectifier transistor 101 may be configured to produce the rectified output signal based on a conduction of charge carriers to the drain or collector terminal during the transistor on-state and a prevention of charge carrier conduction to the drain or collector terminal during the transistor off-state.

For example, during the transistor on-state, a current (e.g. due to charge carrier conduction) may flow through the rectifier transistor, e.g. from the source or emitter terminal to the drain or collector terminal, based on a gate voltage provided to a gate or base terminal of the rectifier transistor and when the rectifier transistor is forward biased by a potential applied by the input signal at the source or emitter terminal. For example, this may occur during a first input signal level or positive wave cycle, e.g. when a voltage of the input signal at the source or emitter terminal is larger than a voltage at the drain or collector terminal and if the voltage of the input signal exceeds that of an on-state threshold voltage of the rectifier transistor.

For example, during a transistor off-state, the rectifier transistor may prevent or block current from flowing through the rectifier transistor (e.g. neglecting leakage currents). For example, the rectifier transistor in a transistor on-state may enable 100 times more current to flow through the rectifier transistor than in a transistor off-state. For example, during the transistor off-state, a gate voltage may be provided from the gate or base terminal of the rectifier transistor, so that a conductive channel through the rectifier transistor is suppressed, and the rectifier transistor may be reverse biased by the potential applied by the input signal at the source or emitter terminal. For example, this may occur during a second input signal level or negative wave cycle, e.g. when a voltage of the input signal at the source or emitter terminal is smaller than a voltage at the drain or collector terminal.

Due to the rectifier control circuit controlling the conduction and blocking phases of the rectifier transistor, a rectified output signal may be provided to the output terminal 108 of the rectifying device 100. The output terminal 108 may be connected to a load circuit to which the rectified output signal may be delivered, for example. For example, the load circuit may include a battery, such as a battery of a vehicle, or an electrical device.

The rectifier transistor 101 used in the rectifying device 100 may be a three-terminal device. The "source or emitter terminal" may refer to a first terminal of the three-terminal device, for example. The "drain or collector terminal" may refer to a second terminal of the three-terminal device, for example. The "gate or base terminal" may refer to a third terminal of the three-terminal device, for example. Only two of the transistor terminals may be externally accessible from outside the device or from outside the common semiconductor die, for example. Depending on the circuit requirements, the rectifier transistor or power transistor may be a field effect transistor, (e.g. a metal oxide semiconductor field effect transistor MOSFET) having a source terminal, a drain terminal and a gate terminal, for example, or an insulated gate bipolar transistor (IGBT) or a bipolar junction transistor (BJT) having an emitter terminal, a collector terminal and a base terminal, for example. The rectifier transistor 101 may be a power transistor having a blocking voltage above 10V or above 20V or above 100V and/or may be configured to switch currents above 1 A or above 10 A, for example.

Due the implementation of a rectifier transistor in a rectifying device for rectifying an alternating signal, a voltage drop across the rectifying device may be reduced compared to a rectifying device implemented by using rectifying diodes e.g. p-n-diodes, for example. For example, in the case where the rectifier transistor is a metal oxide semiconductor field effect transistor (MOSFET), the voltage drop across the rectifier transistor may be significantly smaller than a voltage drop across a diode, e.g. a p-n diode. Due to the smaller voltage drop across the rectifier transistor, power losses across the rectifying device may be reduced significantly, for example. Furthermore, due to the connection of the gate or base terminal of the rectifier transistor to a rectifier control circuit formed on the same common semiconductor die, the source or emitter terminal and the drain or collector terminal may be the only externally accessible terminals of the rectifying device. This may allow a conventional two terminal rectifying device (e.g. a p-n diode) to be easily replaced with a rectifier transistor, where only two of the three terminals of the rectifier transistor may be externally accessible terminals, for example.

Figure 2:
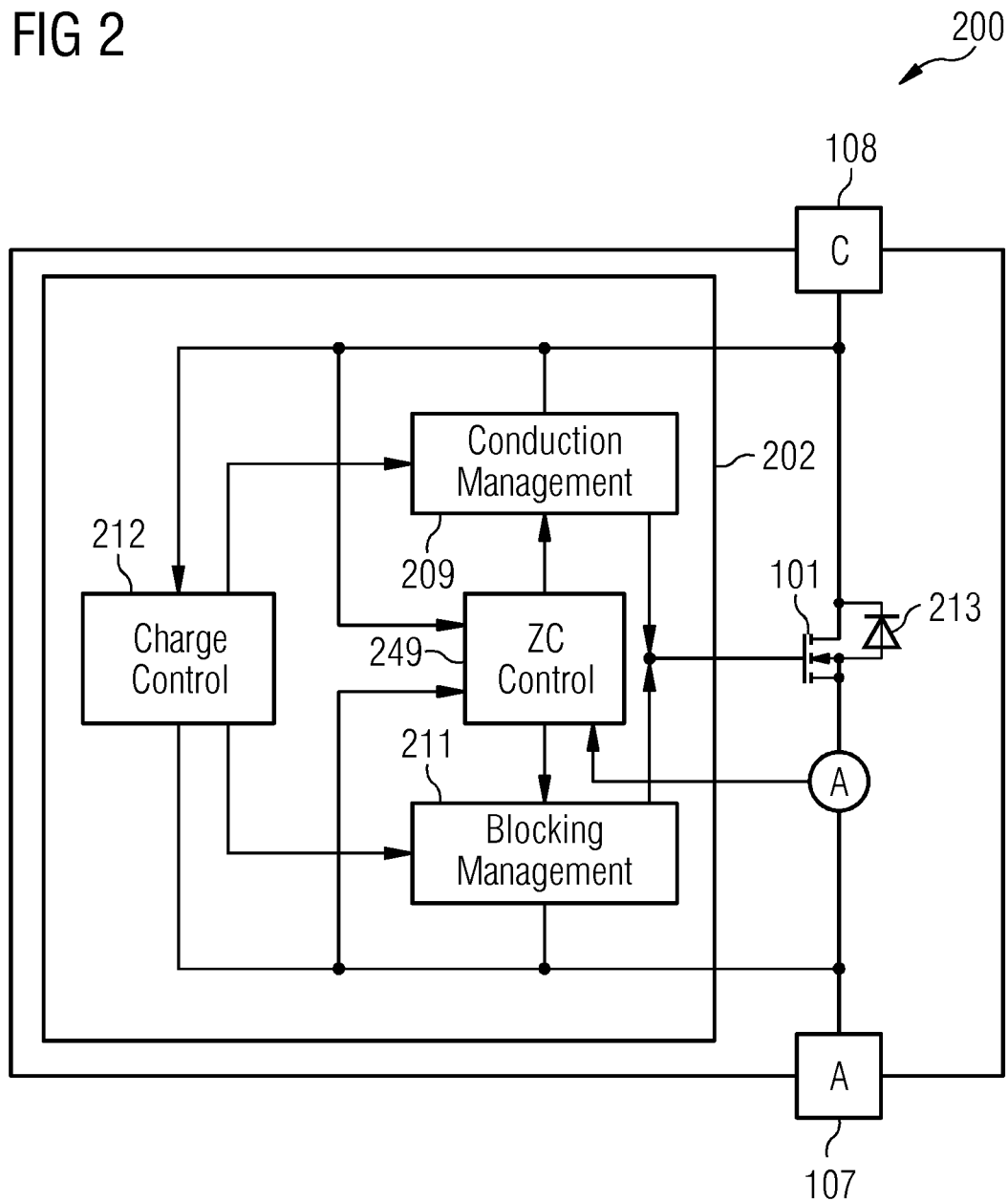
FIG. 2 shows a schematic block illustration of a further rectifying device.

FIG. 2 shows a schematic block illustration of a rectifying device 200 according to an embodiment. The rectifying device 200 may be similar to the rectifying device described with respect to FIG. 1. For example, the rectifying device 200 may include a rectifier transistor 101 and a rectifier control circuit 202 formed on a common semiconductor die. For example, the rectifying device 200 may also include an input terminal 107 (which may also be referred to as an anode) and an output terminal 108 (which may also be referred to as a cathode). The rectifier control circuit may include conduction management circuitry 209 and blocking management circuitry 211, a switching control circuit 249 and a charge control circuit 212 formed on the common semiconductor die, for example.

The rectifier transistor 101 may be a bulk MOSFET transistor, such as an n-channel bulk MOSFET, for example (represented in FIG. 2). In an n-channel MOSFET, the body region may have a p-type doping whereas the source region may have an n-type doping, for example. A body region of the rectifier transistor 101 may be short-circuited or shorted (e.g. electrically connected) to a source terminal or source region of the rectifier transistor 101 to reduce the effect of a parasitic diode between the source region and the body region. Due to the opposite doping type in the drain region (e.g. having an n-type doping) and the body region (e.g. having an p-type doping), a parasitic body diode 213 may be formed between the body region and the drain terminal, when certain source-drain voltages are applied, for example.

The rectifier control circuit 202 may be configured to provide a gate voltage to the gate or base terminal of the rectifier transistor 101 based on charge stored by the charge control circuit 212. The charge control circuit may include a charge pump circuit, a bootstrap-setup or an energy storage in a magnetic field, for example. For example, the charge control circuit 212 may be configured to store charge provided by the input signal while the transistors is in a transistor-off state. For example, at second input signal level (e.g. when a voltage measured between the cathode to the anode VCA is positive), the switching control circuit 249 may produce a control signal having the second output state which may cause the rectifier transistor to switch to a transistor off-state, for example. For example, the rectifier transistor 101 may be reverse-biased and the rectifier transistor 101 may block a flow of current through the rectifier transistor. The charge control circuit 212 may also be configured to store charge generated by the reverse-biased voltage applied between the cathode and the anode based on a second output state of the control signal, for example.

The rectifier control circuit 202 may be configured to switch the rectifier transistor 101 to a transistor on-state or to a transistor off-state based on a zero-crossing value of a voltage signal present at the source or emitter terminal or at the drain or collector terminal of the rectifier transistor. For example, the switching control circuit 249 may be implemented as a zero-crossing (ZC) control circuit. For example, the switching control circuit 249 may include a comparator circuit, e.g. a voltage or current comparator circuit, configured to generate the control signal based on a zero-crossing detection of a voltage or current signal present at the source or emitter terminal or at the drain or collector terminal of the rectifier transistor 101. The switching control circuit 249 may be the central control, for example. In other examples, the switching control circuit 249 circuit may measure an output voltage and/or an output current or may determine in an appropriate manner, another control variable (e.g. temperature, frequency, duty cycle, voltage-current slope, or conduction angle) for switching the output rectifier transistor 101 to the transistor on-state or the transistor off-state.

The conduction management circuitry 209 may switch on the rectifier transistor 101 if needed. For example, the control signal produced by the switching control circuit 249 may trigger the conduction management circuitry 209 to switch on the rectifier transistor 101. The blocking management circuitry 211 may switch off the output transistor 101 if needed. For example, the output control signal produced by the switching control circuit 249 may trigger the blocking management circuitry 211 to switch off the rectifier transistor 101.

For example, the rectifier control circuit may be configured to provide a gate voltage to the gate or base terminal of the rectifier transistor 101 to switch the rectifier transistor 101 to the transistor on-state based on a control signal having the first output state. The gate voltage may be provided based on stored charge in the charge control circuit 212 during the transistor off-state (e.g. during a positive half-wave of VCA). The gate voltage may generate a transistor channel region including charge carriers under the gate, for example. The charge carriers may be conducted by a potential difference generated between the source or emitter terminal and the drain or collector terminal by the input signal (e.g. at least partially during a negative half-wave cycle of the input signal VCA).

The rectifier control circuit may be configured to provide a gate voltage to the gate or base terminal of the rectifier transistor 101 to switch the rectifier transistor to the transistor off-state, based on a control signal having the second output state. The provided gate voltage may suppress the conductive channel region. The charge control circuit 212 may be configured to store the charge generated by the input signal during the transistor off-state (e.g. during a positive half-wave cycle of the input signal VCA).

Although shown as two separate circuit blocks in FIG. 2, it may be understood that the conduction management circuitry 209 and blocking management circuitry 211 may include one or more shared (or common) circuit components to carry out the tasks of conduction management and blocking management, for example. For example, it may be possible that one or more or all of the circuit components used for conduction management and blocking management may be shared (or jointly used).

Due to the formation of a rectifier transistor and a rectifier control circuit (including a charge control circuit and switching control circuit) on a common semiconductor die, an on-chip generated supply voltage (e.g. the gate voltage) based on stored charges in the charge control circuit may be used to switch the rectifier transistor to the transistor on-state or the transistor off-state, for example. The rectifier control circuit may output the control signal based on the input signal (VCA) delivered to the rectifying device, for example, and further external control circuits or power supplies for switching the rectifier transistor or for operating the rectifying device may be omitted, for example.

More details and aspects are mentioned in connection with the embodiments described above or below (e.g. regarding the rectifying device, the rectifier transistor, the rectifier control circuit, the switching control circuit, the charge control circuit, the conduction management circuitry and the blocking management circuitry). The embodiment shown in FIG. 2 may comprise one or more optional additional features corresponding to one or more aspects mentioned in connection with the proposed concept or one or more embodiments described above (e.g. FIG. 1) or below (e.g. FIG. 3 to FIG. 13).

Figure 3:
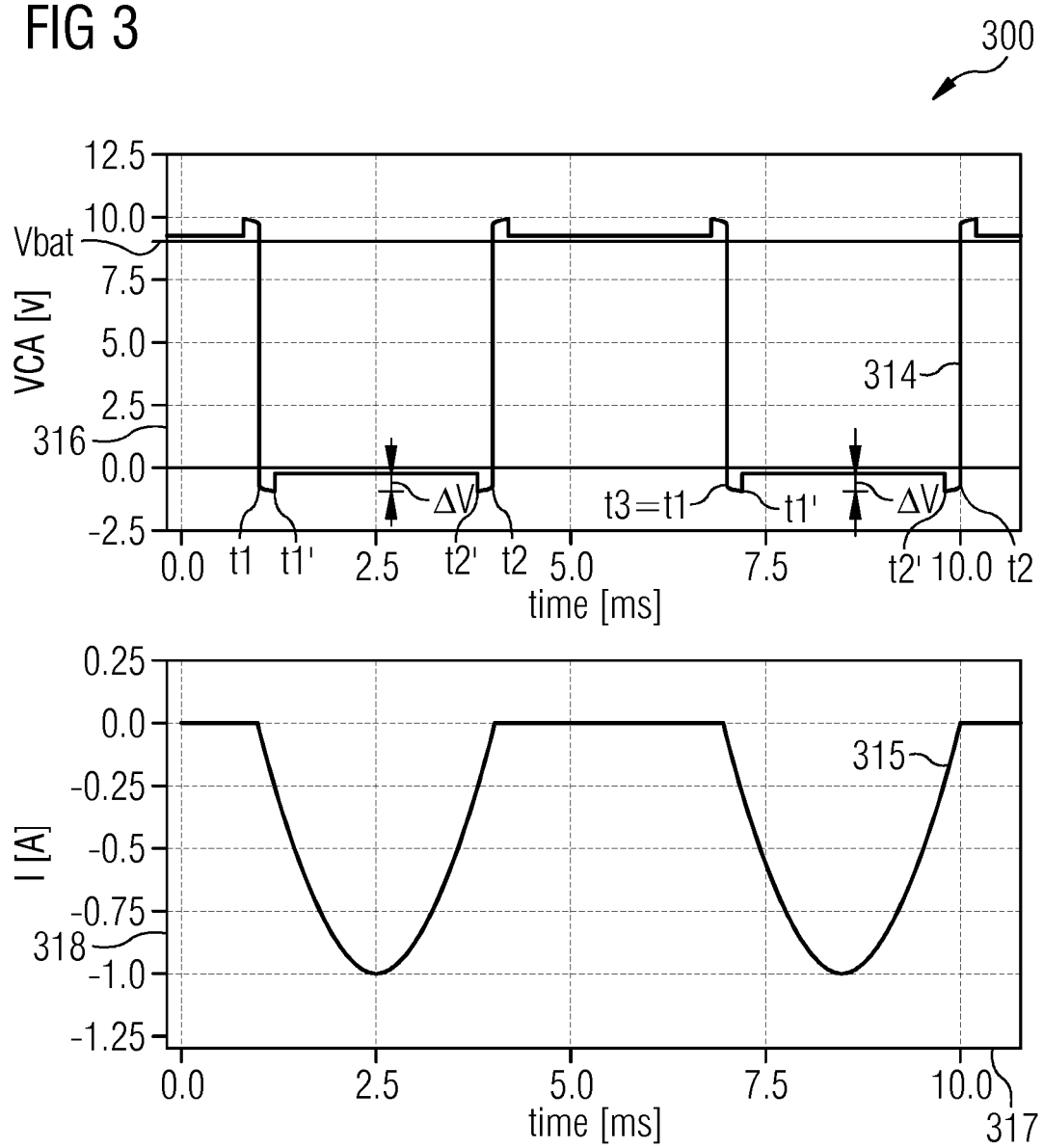
FIG. 3 shows a signal waveform of voltage across a cathode and anode of a rectifying device and an associated rectified waveform.

FIG. 3 shows a signal waveform 314 of voltage across a cathode and anode of a rectifying device and an associated rectified waveform 315 according to an embodiment. The figure shows a signal progression during a blocking and conduction phase of a rectifying device, for example.

The waveform 314 may be represented as a plot of voltage VCA (V) 316 across the cathode and anode with respect to time 317 (ms). The rectified waveform 315 may be represented on a plot of current 318 (A) with respect to time 317 (ms).

A delivered signal or delivered current from an alternator or generator circuit may be an alternating input signal or a sinusoidal wave, for example. By implementing the rectifying device in a circuit pathway of an alternator/generator, only one half-wave (e.g. the negative half-wave) may be crucial for the rectifier as the other half-wave (e.g. the positive half-wave) may be blocked from the component.

When rectifying diodes are implemented, a resulting voltage drop when using rectifying diodes may be an approximate square wave signal, for example. A maximum voltage VCA_max may be approximately equal to Vbat+1V (e.g. VCA_max=~Vbat+1V). A minimum voltage VCA_min may be approximately equal to −1V (e.g. VCA_min=~−1V). Vbat may be a voltage at a battery or a load to which the rectified signal may be supplied or delivered, for example. A voltage drop across the rectifying diode of approximately 1V may result in significant heat or power losses.

During a conduction phase, current may be conducted across the forwards driven parasitic bulk-drain diode or the channel (e.g. between the source or emitter terminal and the drain or collector terminal) only during the negative half-wave (t1 to t2), when the voltage at the input terminal 107 (anode A) is larger than the voltage at the output terminal 108 (cathode C), for example.

During the positive half-wave, (t2 to t3) the component may be blocked. For example, in the blocking phase (t2 to t3), the applied voltage may be blocked and no (or minimal) current or leakage current may flow, for example. In the conduction phase (t1 to t2), the current may be able to pass unhindered. The residual resistance of the circuit arrangement may be as small as possible to keep the power losses as low as possible, for example.

As the rectifying device (100 or 200) uses a rectifier transistor 101 instead of a rectifying diode, the voltage drop across the rectifier transistor may be reduced from Vf, the forward voltage of a diode, of approximately 1 V, to Ron× Iload through the rectifier transistor, for example. Ron may be the on-resistance of the rectifier transistor and Iload may be the current to be delivered at the load, for example. Through an appropriate dimensioning of the rectifier transistor size, Ron may be chosen so that the voltage drop across the rectifier transistor may be reduced, for example, so that during operation, the voltage drop across the rectifier transistor (or the on-state threshold value of the rectifier transistor) may be about 0.2V instead of 1V. In order to short-circuit the parasitic body diode of the MOSFET transistor, the MOSFET transistor 101 may be switched on by a voltage supplied between gate and source, e.g. by applying a gate voltage to the gate or base terminal, as long as the voltage drop at the diode between anode and cathode is positive, (e.g. VAC is positive or VCA is negative), for example. For example, the rectifier control circuit 202 may be configured to switch the rectifier transistor to a transistor on-state if a voltage signal present at the input terminal is larger than an on-state threshold voltage of the rectifier transistor.

To operate the rectifying device, an amount of energy (e.g. the stored charge) may be extracted during the blocking phase and may be used during the conduction phase to switch on the MOSFET transistor 101, for example. For example, one or more capacitors may be used during the blocking phase, for example, to store charge or energy. This task may be carried out by the charge control circuit 212, for example. The switching control circuit 249 (e.g. the ZC control) may, for example, detect the zero-crossing of the voltage drop between the input terminal 107 (e.g. anode A) and the output terminal 108 (e.g. cathode C). From the time t2, the conduction management circuitry (or the charge control circuit 212) may be active and may begin to store charge and at about the same time, the rectifier transistor 101 may be switched off by the blocking management circuitry 211, for example.

At the beginning of the conduction phase (t3=t1), the current may begin to flow through the rectifying device from the input terminal 107 (e.g. the anode) to the output terminal 108 (e.g. the cathode), for example. As at this time the rectifier transistor may not yet be switched on, a voltage of about negative 0.7 V to negative 1 V may first arise as the current may flow over the parasitic bulk drain diode 213, for example.

At time t1', the switching control circuit 249 (e.g. the ZC control circuit) may recognize that the rectifier transistor 101 is to be switched on in order to reduce the power loss as the drop at the channel of the rectifier transistor 101 may be significantly smaller than the parasitic bulk-drain diode 213. The task of turning on the rectifier transistor may be carried out by the conduction management circuitry, for example.

At the end of the conductive phase t2, the sign of the voltage VAC (or VCA), e.g. at the diode, may be changed. A reverse recovery time may pass (e.g. a delayed turn off), which may create higher cross currents that flow in the systems, which may again increase that power losses and may inject voltage disturbances into the battery power.

In order to avoid current flows across the parasitic bulk drain diode 213 and/or cross currents during turn-on or turn-off delays, the switching control circuit 249 may be configured to switch the rectifier transistor 101 to the on-state or the off-state before these currents flow. For example, the switching control circuit 249 may be configured to switch off the rectifier transistor 101 already at time t2', just before the sign of the voltage VCA changes. The recognition of t2' may be carried out e.g. through a time measurement of the previous oscillation period or through a current measurement, for example. For example, the rectifier control circuit 202 may further include a timing circuit configured to produce a timing signal based on an oscillation period of the input signal received at the input terminal of the rectifying device 200. The rectifier control circuit 202 may be configured to switch the rectifier transistor 101 to a transistor on-state or to a transistor off-state based on the timing signal from the timing circuit.

The stored charge or energy may last only for a finite or limited holding time (e.g. during the conduction phase) due to leakage current, its own power consumption, and the energy needed for switching on the rectifier transistor, for example. Therefore, the energy reservoir may be reloaded from time to time, e.g. by refreshing during the blocking phase, for example. The maximum conduction phase of the rectifying device circuit may be based on or depend on the size of the energy storage and the current energy consumption. For example, in vehicle generator applications, a maximal conduction phase of about (60/750 RPM)/2=40 ms may be expected.

Due to the implementation of a rectifier control circuit, a charge control circuit and a rectifier transistor formed on a common semiconductor die of a rectifying device, the charge control circuit may be used to provide the supply voltage (e.g. the gate voltage) for switching the rectifier transistor to the on-state or the off-state, for example. There may be no further need for external control circuits or power supplies to be provided for switching the rectifier transistor or for operating the rectifying device, for example. Furthermore, power losses may be reduced by selecting a rectifier transistor with a suitable on-resistance which reduces a voltage drop across the rectifier transistor in comparison with a voltage drop in normal diodes, for example. Due to the implementation of a rectifier control circuit having a switching control circuit in connection with the charge control circuit and the rectifier transistor, further power losses caused by turn-on and turn-off delays in the rectifier transistor may be prevented, for example. Furthermore, power losses caused by currents through parasitic body diodes may be prevented, for example.

More details and aspects are mentioned in connection with the embodiments described above or below (e.g. regarding the rectifying device, the rectifier transistor, the rectifier control circuit, the switching control circuit, the charge control circuit, the conduction management circuitry and the blocking management circuitry). The embodiment described with respect to FIG. 3 may comprise one or more optional additional features corresponding to one or more aspects mentioned in connection with the proposed concept or one or more embodiments described above (e.g. FIG. 1 or 2) or below (e.g. FIG. 4 to FIG. 13).

Figure 4:
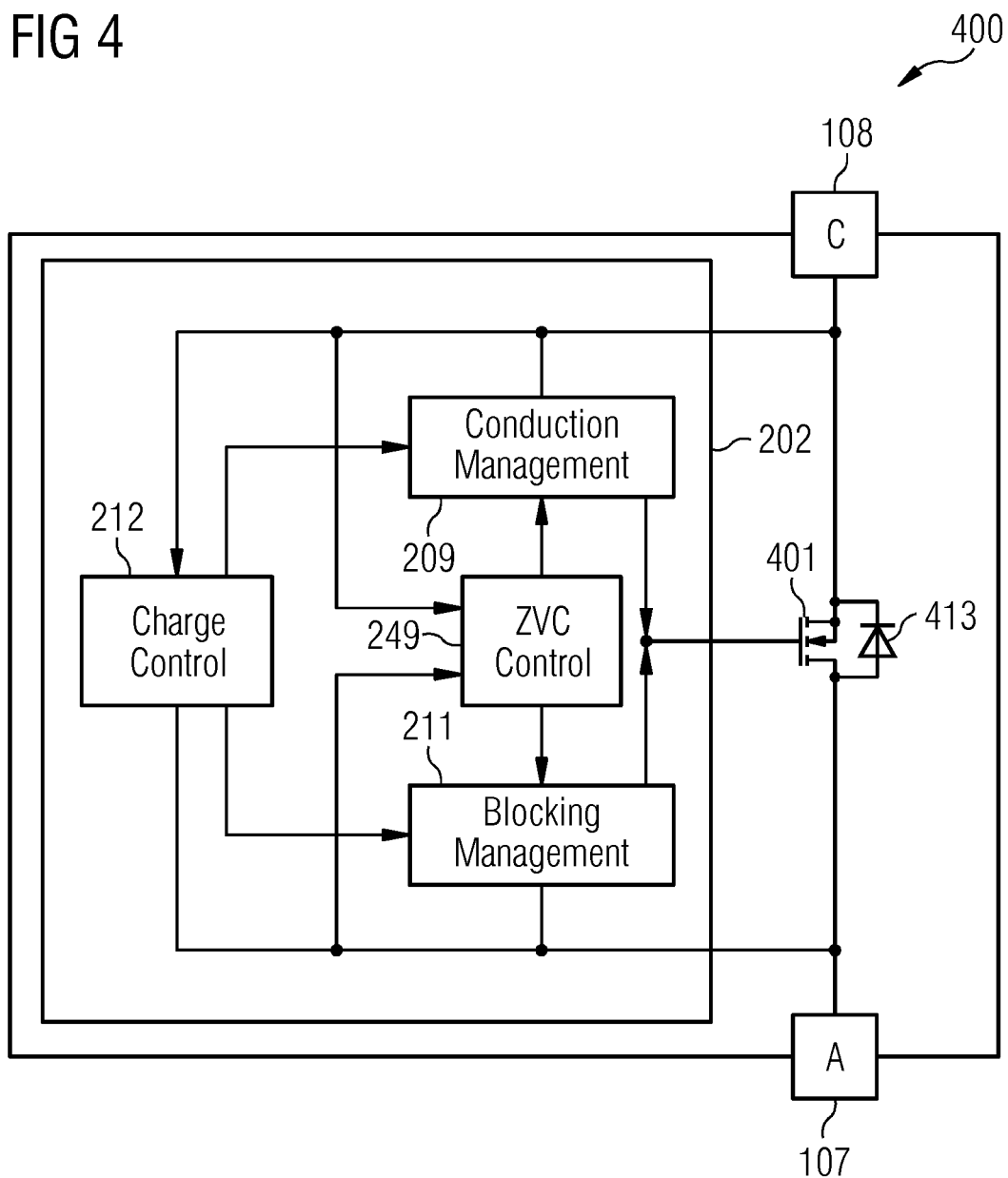
FIG. 4 shows a schematic block illustration of a further rectifying device.

FIG. 4 shows a schematic illustration of a rectifying device 400 according to an embodiment. The rectifying device 400 may be similar to the rectifying devices described with respect to FIGS. 1 to 3. For example, the rectifying device 400 may include a rectifier transistor 401 and a rectifier control circuit 202 formed on a common semiconductor die. For example, the rectifying device 200 may also include an input terminal 107 (which may also be referred to as an anode) and an output terminal 108 (which may also be referred to as a cathode). The rectifier control circuit may include conduction management circuitry 209 and blocking management circuitry 211, a switching control circuit 249, a charge control circuit 212 and a monolithic diode 413 formed on the common semiconductor die, for example.

A body region of the rectifier transistor 401 may be short-circuited or shorted (e.g. electrically connected) to a drain or collector terminal of the rectifier transistor 401 instead of the source or emitter terminal. The monolithic diode 413 may be implemented in parallel to the rectifier transistor 401, for example. The operation of the rectifying device 400 is described further with respect to FIG. 5.

Due to the body region of the rectifier transistor being short-circuited to the drain or collector terminal, the effect of a parasitic diode between the drain region and the body region, may be reduced, for example.

More details and aspects are mentioned in connection with the embodiments described above or below (e.g. regarding the rectifying device, the rectifier transistor, the switching control circuit, the rectifier control circuit, the charge control circuit, the monolithic diode, the conduction management circuitry and the blocking management circuitry). The embodiment shown in FIG. 4 may comprise one or more optional additional features corresponding to one or more aspects mentioned in connection with the proposed concept or one or more embodiments described above (e.g. FIGS. 1 to 3) or below (e.g. FIG. 5 to FIG. 13).

Figure 5:
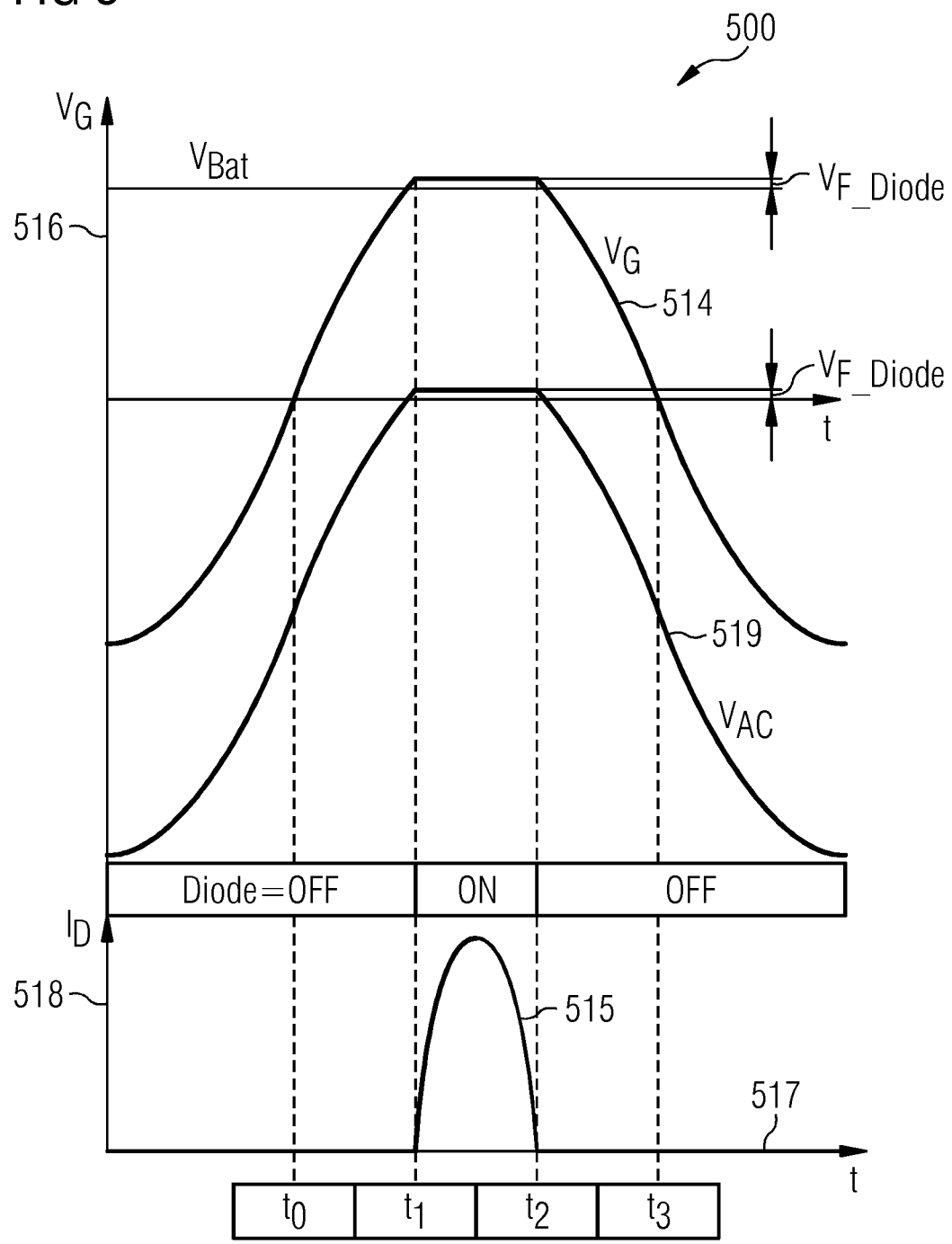
FIG. 5 shows a signal waveform of voltage across a cathode and anode of a rectifying device and an associated rectified waveform.

FIG. 5 shows an alternating signal waveform 514 of voltage across a cathode and anode of a rectifying device (e.g. rectifying device 400) and an associated rectified waveform 515 according to an embodiment. The figure shows a signal progression during a blocking and conduction phase of a rectifying device, for example. The rectifying device with rectifier control capabilities may be implemented in a generator or alternator for a vehicle, for example.

The alternating waveform 514 may be represented as a plot of voltage VCA (V) across the cathode and anode with respect to time 517 (ms) and may be based on a delivered signal or delivered current from an alternator or generator circuit. The rectified waveform 515 may be represented on a plot of current 518 (A) conducted between the cathode and anode with respect to time 517 (ms).

The alternating waveform 514 shows a voltage VG (V) 516 based on a generator input signal with respect to time 517. The alternating waveform VAC (V) 519 shows voltage across the anode and cathode with respect to time 517. The rectified waveform 515 shows current ID (A) through the rectifying device 518 with respect to time 317 (ms).

A delivered voltage from the generator (e.g. VG) may be a sinusoidal wave. Current may be conducted through the forward biased rectifying diode 413 to the vehicle battery only during the positive half-wave (e.g. from t0 to t3), and if the generator-delivered voltage is higher than the voltage at the battery to be charged (e.g. from t1 to t2), for example. During the negative half-wave, (t3 to t0), the rectifying diode 413 may be blocked. The monolithic rectifying diode 413 may mostly only be briefly conductive, during the conduction angle (t1 to t2), and may lead to a relative high semi sinusoidal-pulse current. As shown in FIG. 5, The rectifying diode 413 may have a forward voltage VF_DIODE during the conduction phase.

During the blocking phase (t0 to t1, t2 to t3, t3 to t0), the applied voltage may be blocked and no current or leakage current should flow, for example. In the conducting phase (t1 to t2), the current should pass unhindered, and the residual resistance of the diode 413 may be as small as possible. The MOSFET transistor 401 may be controlled by a voltage between the gate and drain, to short circuit the body diode of the MOSFET when the voltage drop at the diode between the input terminal 107 (e.g. anode A) and the output terminal 108 (e.g. cathode C) is positive, In order to operate the rectifier control circuit, an energy quantity may be extracted during the blocking phase. The energy quantity may be used to control the MOSFET during the conduction phase. For example, the energy quantity may be saved during the blocking phase and may charge one or more capacitors, e.g. to save this energy. The task may be controlled or carried out by the charge control circuit 212.

The switching control circuit 249 (e.g. a zero voltage cross circuit) may detect the zero crossings of the voltage drops between the input terminal 107 (e.g. anode A) and the output terminal 108 (e.g. cathode C) of the rectifying device arrangement. At time t2, or with slight delay, the charge control circuit 212 and the blocking management circuitry 211 may be activated. The blocking management circuitry 211 may short circuit the gate or base to source or emitter path of the rectifier transistor, and the charge control circuit 212 may begin to store charge.

At the end of the blocking phase (t1), the charge control circuit 212 may be turned off and the conduction management circuitry 209 may be activated. The gate to drain path may be controlled or biased with a positive voltage at the gate or base terminal to switch on the rectifier transistor 401 e.g. a power MOSFET transistor. The drop at the diode path may be significantly smaller than the MOSFET reverse diode.

At the end of the conduction phase, the voltage of the diode may change sign (e.g. the negative half-cycle of VCA may change to a positive half-cycle). The switching control circuit 249 (e.g. ZC circuit) may activate the charger control circuit 212 and the blocking management circuitry 211 again, and the cycle may start from the beginning, for example.

As the stored energy may last only for a limited holding time due to leakage current and its own power consumption, the energy reservoir may be reloaded or refreshed from time to time. The lower frequency limit of the diode may be given by the refresh rate Tr according to fg=1/Tr. In vehicle generator application, the frequency limit from of about 10 Hz may be sufficient (according to 600 RPM).

More details and aspects are mentioned in connection with the embodiments described above or below (e.g. regarding the rectifying device, the rectifier transistor, the rectifier control circuit, switching control circuit, the charge control circuit, the conduction management circuitry and the blocking management circuitry). The embodiment shown in FIG. 5 may comprise one or more optional additional features corresponding to one or more aspects mentioned in connection with the proposed concept or one or more embodiments described above (e.g. FIGS. 1 to 4) or below (e.g. FIG. 6 to FIG. 13).

Figure 6:
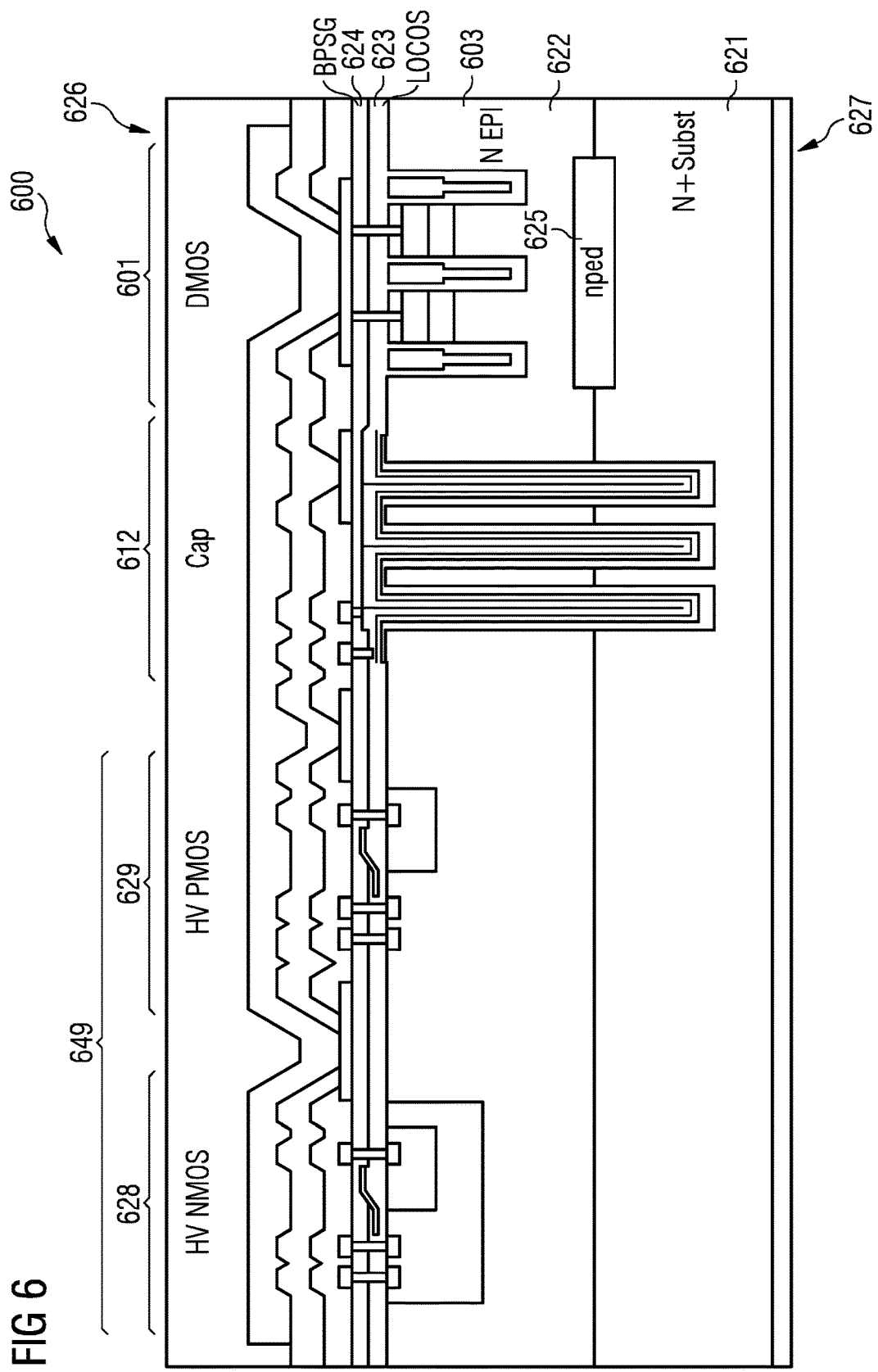
FIG. 6 shows a schematic cross-sectional illustration of a further rectifying device.

FIG. 6 shows a schematic cross-sectional illustration of a rectifying device 600 according to an embodiment. The rectifying device 600 may be similar to the rectifying devices described with respect to FIGS. 1 to 5.

For example, the rectifying device 600 may include a rectifier transistor 601, the switching control circuit 649 and a charge control circuit 612, for example. For example, the rectifier transistor 601, the charge control circuit 612 and the switching control circuit 649 of a rectifier control circuit may be formed on a common semiconductor die 603, for example.

Furthermore, the common semiconductor die 603 may include a first highly doped substrate region 621, e.g. an n+ substrate region. The semiconductor die 603 may include an epitaxial substrate region 622, e.g. an n-doped epitaxial region, formed over the first highly doped substrate region 621. A n type-pedestal region (nped) 625 may be formed between and at least partially in the epitaxial substrate region 622 and the first highly doped substrate region 621. The nped region 625 may be formed in the drift region of the rectifier transistor 601 which may include a power transistor, e.g. a double-diffused metal-oxide-semiconductor transistor (DMOS), for example. The nped region 625 may be formed before the formation of the n-doped epitaxial region 622, for example. The nped region 625 may reduce the break through voltage (or breakdown voltage) and may improve the on resistance (RDSON) of the rectifier transistor 601, for example. The nped region 625 may reduce the breakdown voltage from about 40 V-45 V to about 20 V so that a zener clamping circuit may optionally be omitted, for example.

The rectifying device 600 may have a solderable front side 626 and solderable back side 627, for example, for connecting the rectifying device to a semiconductor chip housing or to a semiconductor chip package. One or more layers, e.g. a Borophosphosilicate glass (BPSG) layer 624 and a local oxidation of silicon (LOCOS) layer 623 may be formed at or towards the front side 626 of the chip. The source or emitter terminal and the gate or base terminal of the rectifier transistor 601 may be formed at (or towards or close to) the front side 626 of the semiconductor die 603, and the drain or collector terminal may be formed at (or towards or close to) a back side 627 of the semiconductor die 603, for example. For example, the input terminal of the rectifying device may be located at the front side 626 (e.g. a first side) of the common semiconductor die 603 and the output terminal of the rectifying device may be located at the back side 627 (e.g. a second side) of the common semiconductor die 603, opposite to the first side of the common semiconductor die.

The rectifier control circuit may include one or more circuits, for example, one or more high-voltage n-type MOS transistors 628 (HV NMOS) and/or one or more a high voltage p-type MOS transistors 629 (HV PMOS) for controlling the rectifying device, for example.

The charge control circuit 612 may include one or more storage elements or one or more capacitors. The capacitors may comprise one or more vertical capacitor trenches 631, 632, 633, for example. The vertical capacitor trenches 631, 632, 633 may be formed in the common semiconductor die 603, and may extend vertically from the front side 626 of the semiconductor die 603 into the semiconductor die substrate region, (e.g. into the epitaxial substrate region 622 and/or the first highly doped well region 622), for example. The vertical capacitor trenches 631, 632, 633 may extend to a depth of about 10 to 200 μm.

The rectifier transistor 601 may be a power transistor, such as a MOSFET. The MOSFET may be a vertical MOSFET having the drain electrode at the backside 627 and the source electrode at the front side 626. The MOSFET may use the substrate region 621 as a part of the drift region. The drift region may additionally comprise the n type-pedestal region (nped) 625 at least part of the optional epitaxial substrate region 622.

At least one gate trench 660 comprising an insulation layer 662 and a gate electrode 665 may be arranged in the semiconductor die. A body region 668 and a source region 669 with a higher doping concentration than the drift region may be formed adjacent to the at least one gate trench.

For exceptionally high currents, an IGBT transistor may be used instead of a MOSFET transistor, for example. BJT transistor variants may also be possible, However compared to a MOSFET, a saturation voltage between a collector and emitter terminals of the BJT, e.g. VCE_sat may be greater than 0 V.

In order that the input terminal (e.g. the anode) and the output terminal (e.g. the cathode) of the rectifying device are provided as the only externally accessible terminals or connections in a two-terminal housing (e.g. a press-fit housing), and to avoid a multi-chip construction design, the energy storage element (e.g. 612) and the switching control circuit (e.g. 649) for the rectifier transistor (e.g. the MOSFET) may be monolithically integrated and isolated against the contacts on a common semiconductor die, for example. This may be achieved easily with oxide, e.g. an imide deposition, for example. The rectifier transistor (e.g. the MOSFET) may be provided with a solderable back and front side, and may subsequently be processed in a two-terminal housing (e.g. a press-fit housing), like p-n diodes or e.g. high efficiency diodes (HED). An excellent cooling of the MOSFETs may be ensured, so that the effects of load dump pulses generated by MOSFET operation in avalanche may be dissipated or reduced, for example.

Due to the implementation of a rectifier transistor, a switching control circuit and a charge control circuit on a common semiconductor die, a fully integrated, monolithic device may be implemented in a press-fit package, and as a plug and play device in any generator, without complex reconstruction efforts, for example.

More details and aspects are mentioned in connection with the embodiments described above or below (e.g. regarding the rectifying device, the rectifier transistor, the rectifier control circuit, the switching control circuit, the charge control circuit, and the common semiconductor die). The embodiment shown in FIG. 6 may comprise one or more optional additional features corresponding to one or more aspects mentioned in connection with the proposed concept or one or more embodiments described above (e.g. FIGS. 1 to 5) or below (e.g. FIG. 7 to FIG. 13).

Figure 7:
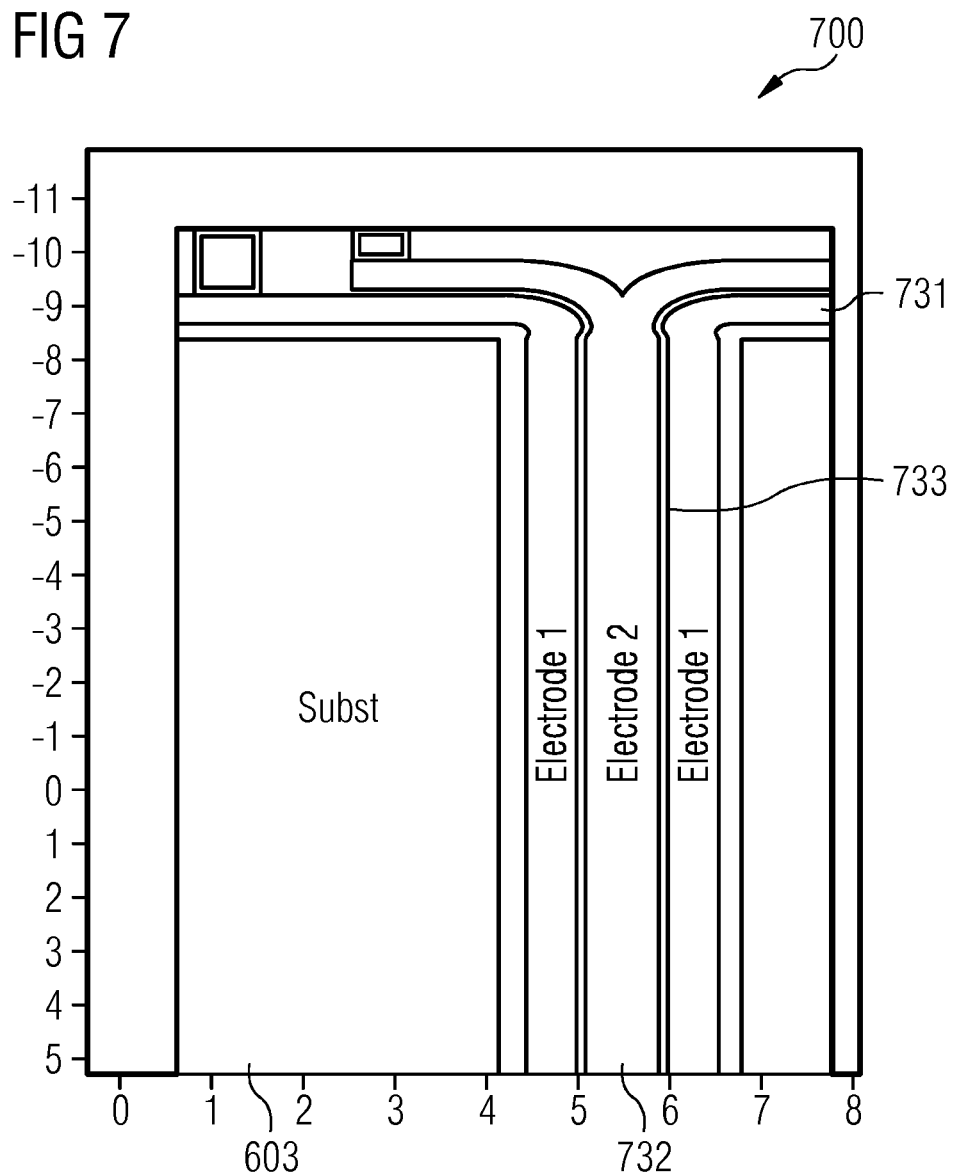
FIG. 7 shows a detailed schematic illustration of a capacitor for storing charge in a rectifying device.

FIG. 7 shows a detailed schematic illustration of a capacitor 700 used for storing charge in a rectifying device according to an embodiment.

The capacitor 700 may be implemented as part of a charge control circuit of a rectifying device and formed on a common semiconductor die with a rectifier transistor and a switching control circuit, for example. The capacitor 700 may include a first vertical electrode 731 and at least one second vertical electrode 732 for example. For example, a first electrode 731 may be adjacent to at least part of the second vertical electrode 732 and may be separated from the second vertical electrode 732 by a dielectric material 733, for example. Charge may be stored in the capacitor 700 based on a control signal provided by a switching control circuit of the rectifying device, for example It may be understood that one or more capacitors may be used to store the charge. For example, a plurality of capacitors may be arranged in a charge pump or boot strap configuration may be used. It may be possible that instead of or in addition to capacitors, one or more coils (e.g. inductance coils) may be used as an energy storage.

Due to the implementation of a capacitor in the common semiconductor die. No further external control circuit or power supply need be provided for switching the rectifier transistor or for operating the rectifying device, for example.

More details and aspects are mentioned in connection with the embodiments described above or below (e.g. regarding the rectifying device, the rectifier transistor, the rectifier control circuit, the switching control circuit, the charge control circuit, the conduction management circuitry and the blocking management circuitry). The embodiment shown in FIG. 7 may comprise one or more optional additional features corresponding to one or more aspects mentioned in connection with the proposed concept or one or more embodiments described above (e.g. FIGS. 1 to 6) or below (e.g. FIG. 8 to FIG. 13).

Figure 8:
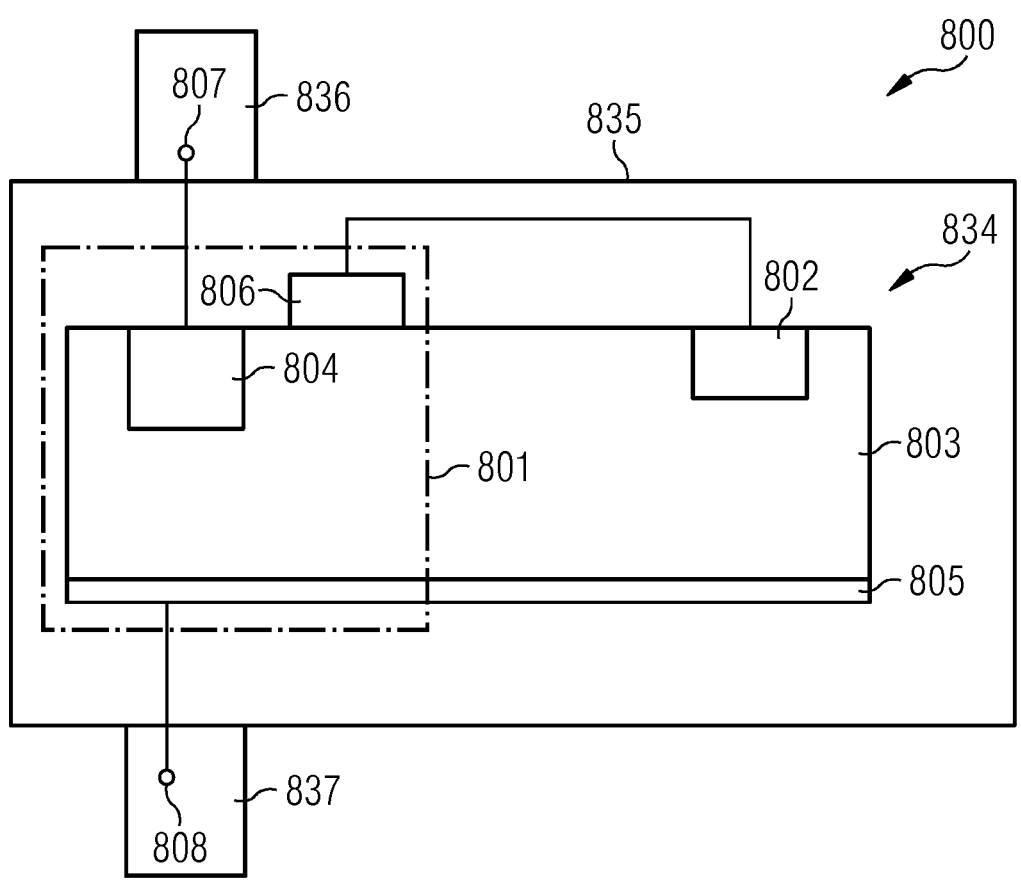
FIG. 8 shows a rectifier arrangement including a rectifying device and a housing.

FIG. 8 shows a rectifier arrangement 800 according to an embodiment.

The rectifier arrangement 800 includes a rectifying device 834 which includes a rectifier transistor 801 and a rectifier control circuit 802 formed on a common semiconductor die 803. The rectifier transistor 801 includes a source or emitter terminal 804, a drain or collector terminal 805 and a gate or base terminal 806. An input terminal 807 of the rectifying device 834 is coupled to the source or emitter terminal 804 of the rectifier transistor 801. An output terminal 808 of the rectifying device 834 is coupled to the drain or collector terminal 805 of the rectifier transistor 801. The gate or base terminal 806 of the rectifier transistor 801 is coupled to the rectifier control circuit 802.

The rectifier arrangement 800 further includes a housing 835 enclosing the rectifying device 834. The housing 835 includes a first externally accessible terminal 836 connected to the input terminal 807 of the rectifying device 834 and a second externally accessible terminal 837 connected to the output terminal 808 of the rectifying device 834.

Due to the implementation of the rectifying device in a housing with a first externally accessible terminal and a second externally accessible terminal, a fully integrated monolithic rectifying device may be integrated as a plug and play device into any generator or alternator circuit, for example. For example, without complex reconstruction or design efforts, a large group of vehicle classes may be installed with the rectifier arrangement, for example. Furthermore, significant cost benefits compared to module arrangements may be achieved.

In order to dissipate the high heat losses from the semiconductor die or semiconductor chip, e.g. from a silicon chip, a special housing such as a press-fit package or housing may be used. For example, the housing 835 may include or may be a press-fit housing, which may display excellent thermal resistance. Furthermore, the semiconductor die or chip may be cooled from both sides (e.g. from a die front side or a die back side) through large copper surfaces, for example.

Due to the arrangement of the entire rectifier device in the press-fit housing (e.g. housing 835) and connecting the gate or base terminal of the rectifier transistor to a rectifier control circuit on a common semiconductor die, a third contact of the MOSFET need not be externally accessible as it may render the rectifying device non-implementable in a press-fit housing construction design, for example. This may increase the complexity of integrating a three-terminal device in an alternator or generator circuit, for example. In the rectifier arrangement 800, the first externally accessible terminal 836 and the second externally accessible terminal 837 may be the only externally accessible terminals of the housing 835, for example.

More details and aspects are mentioned in connection with the embodiments described above or below (e.g. regarding the rectifier arrangement, the first externally accessible terminal, the second externally accessible terminal, the housing, the rectifying device, the rectifier transistor, the rectifier control circuit, and the charge control circuit). The embodiment shown in FIG. 8 may comprise one or more optional additional features corresponding to one or more aspects mentioned in connection with the proposed concept or one or more embodiments described above (e.g. FIGS. 1 to 7) or below (e.g. FIG. 9 to FIG. 13).

FIG. 9 shows a rectifier arrangement 900 according to an embodiment. The rectifier arrangement 900 may include a rectifying device 834 and a housing 935. The figure shows a rectifying device and a press-fit housing, for example.

The housing 935 may include a press-fit package as housing, for example, which may include a copper-based surrounding material. For example, the housing may include a cup or base portion 938 and a nailhead or top portion 939, as commonly used in press-fit packages for rectifier didoes.

The cup or base portion 938 and/or the nailhead or top portion 939 may be formed from or may be at least partially formed from copper.

The rectifying device may have solderable front and back sides which may be respectively connected (e.g. soldered) to a first externally accessible terminal and a second externally accessible terminal of the housing 935.

For example, the housing may include a base portion 938 (e.g. a holding portion or cup) which may provide the second externally accessible terminal. The base portion 938 may hold the chip and may include a die connection region and a second externally accessible terminal 932. The back side of the semiconductor die (e.g. the rectifying device) may be soldered to the die connection region, for example. The output terminal of the rectifying device may be electrically connected to the second externally accessible terminal 932 of the housing, for example.

The housing may also include a top portion or nailhead 939 which may provide the first externally accessible terminal 931. For example, the first externally accessible terminal 931 may be connected (e.g. soldered) to the front side of the semiconductor die (e.g. the rectifying device. In this way, the input terminal of the rectifying device may be electrically connected to the first externally accessible terminal of the housing, for example.

The rectifying device (which may be implemented as a single semiconductor die or chip), may be mechanically, electrically and/or thermally connected to the base portion 938 the top portion 939 of the housing 935, for example. Insulation or passivation material 937 may be deposited to at least partially surround the semiconductor die 834 and/or the nailheade 939 (e.g. the rectifying device).

The top portion 939 and the base portion 938 of the housing may then be pressed together so that they are tightly or hermetically fixed together, for example. As an alternative or in addition, the semiconductor die 834 (e.g. the rectifying device) may be held or fixed between the base portion 938 and a top portion 939, for example by soldering and the insulation or passivation material 937 may be deposited or molded in the cup 938 and around the semiconductor die 834 and the nailhead 939 to secure positioning of the chip or semiconductor die. The housing 935 may surround and form a protective casing around the rectifying device, while providing thermal conduction from the rectifying device to external surroundings or environment, for example.

The press-fit rectifier package has been described with respect to a simple or simplified example and other press-fit packages or modification to the press-fit package may be equally employed.

Due to the implementation of the rectifying device in a housing with a copper-based surrounding material, thermal conduction from the rectifying device to external surroundings or environment may be improved, particular during the rectification of large currents, for example.

More details and aspects are mentioned in connection with the embodiments described above or below (e.g. regarding the rectifier arrangement, the first externally accessible terminal, the second externally accessible terminal, the housing, and the rectifying device). The embodiment shown in FIG. 9 may comprise one or more optional additional features corresponding to one or more aspects mentioned in connection with the proposed concept or one or more embodiments described above (e.g. FIGS. 1 to 8) or below (e.g. FIG. 10A to FIG. 13).

The embodiments of the rectifying devices described herein may use various parameter values for determining the output state of the control signal of the rectifier control circuit. For example, various parameter values may be used to identify or determine when an input signal reaches a first input level or a threshold value, e.g. when the input signal reaches a threshold level in the negative-half cycle which forward biases the rectifier transistor, (e.g. t1 or t3 as described with respect to FIG. 2), for example. The parameter values may also be used to identify or determine when the switching control circuit 249 may switch the rectifier transistor on, (e.g. t1' as described with respect to FIG. 2), for example. The parameter values may also be used to identify a transition of the input signal from the first input signal level to a second input signal level, e.g. when the input signal switches from the negative half-cycle to the positive half-cycle, (e.g. t2 as described with respect to FIG. 2). The parameter values may also be used to identify or determine when the switching control circuit 249 may switch the rectifier transistor off, (e.g. t2' as described with respect to FIG. 2), for example.

Various circuit concepts may implement various ways for determining the switching points e.g. times points t1/t1', or e.g. t2/t2' (e.g. based on voltage or current measurements). The circuits may differ in terms of complexity, cost, and accuracy of the circuit. Besides the circuit concept wherein time points t1 to t3 are recognized using a voltage measurements, other parameter values may be used by the rectifier control circuit individually or in combination to derive the switching points. Such parameter values may include, for example, current recognition, voltage regulation, temperature monitoring, frequency measurements, duty cycle measurements, voltage-current slopes or conduction angles, for examples. These parameter values differentiate how the points t1/t1' and t2/t2' may be recognized or derived, for example.

Figure 10A:
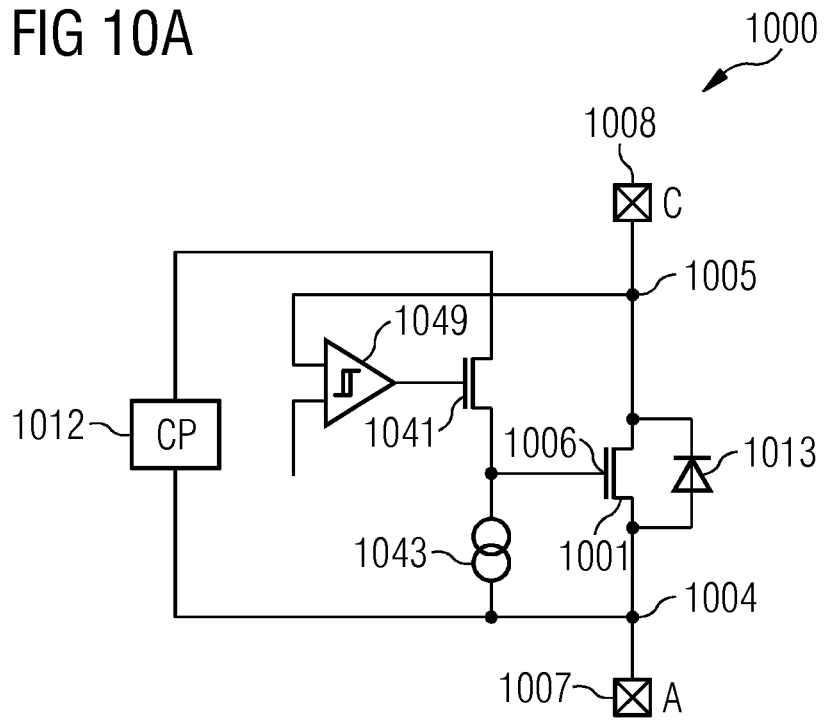
FIG. 10A shows a further rectifying device.

FIG. 10A shows a rectifying device 1000 according to an embodiment. The figure shows an example of a circuit using a voltage measurement, for example. The rectifying device 1000 may be similar to the rectifying devices described with respect to FIGS. 1 to 9.

The rectifying device 1000 may include a rectifier transistor 1001, a switching control circuit 1049 and a charge control circuit 1012. The rectifying device 1000 may further include a control transistor 1041 and a current source 1043. The rectifying device 1000 may further include a monolithic diode 1013.

An input terminal 1007 of the rectifying device 1000 may be coupled to the source or emitter terminal 1004 of the rectifier transistor 1001, for example. The source or emitter terminal 1004 of the rectifier transistor may be coupled to the current source 1043, for example. The source or emitter terminal 1004 of the rectifier transistor may be coupled to a first current source terminal, for example. The first current source terminal and the source or emitter terminal 1004 may be coupled to the charge control circuit 1012, for example. The first current source terminal and the source emitter terminal 1004 may be coupled to a first charge control circuit terminal, for example.

A second current source terminal may be coupled to the control transistor 1041, for example. The second current source terminal may be coupled to a first control transistor terminal, for example. The second current source terminal and the first control transistor terminal may be coupled to the gate or base terminal 1006 of the rectifier transistor 1001, for example.

The second control transistor terminal may be coupled to the charge control circuit 1012, for example. The second control transistor terminal may be coupled to a second charge control circuit terminal, for example.

The control transistor 1041 and the current source 1043 may be coupled in series between the second charge control circuit terminal and the first charge control circuit terminal of the charge control circuit, for example.

The source or emitter terminal 1004 of the rectifier transistor 1001 may be coupled to a diode input terminal of the monolithic diode 1013, for example. A diode output terminal may be coupled to the drain or collector terminal 1005 of the rectifier transistor 1001, for example.

The switching control circuit 1049 may include a comparator circuit, such as a voltage comparator or current comparator, for example. A first comparator input terminal may provide a first reference value Vref to the comparator circuit. A second comparator input terminal may be coupled to the source or emitter terminal 1004 of the rectifier transistor 1001 or the drain or collector terminal 1005 of the rectifier transistor 1001, for example. A comparator output terminal may be coupled to the control transistor gate or base terminal, for example.

The drain or collector terminal 1005 of the rectifier transistor 1001 may be coupled to an output terminal 1008 of the rectifying device 1000, for example.

The rectifier control circuit may be configured to switch the rectifier transistor 1001 to a transistor on-state or to a transistor off-state based on a control signal provided by the comparator circuit. For example, the switching control circuit 1049 may be configured to generate the control signal, for example at the comparator output terminal, based on a comparison of a reference value with a voltage or current signal present at the source or emitter terminal 1004 of the rectifier transistor 1001 or a voltage or current signal present at the drain or collector terminal 1005 of the rectifier transistor 1001.

For example, the rectifier control circuit (or the switching control circuit 1049) may carry out the measurement of the power flow by comparing the voltage at the drain or collector terminal 1005 (e.g. cathode C) of the rectifier transistor 1001 (e.g. a power MOSFET) with respect to a reference potential, e.g. a positive reference voltage Vref. For example, a reference voltage value Vref may be about 200 mV, or e.g. may lie between 100 mV to 300 mV, so that the voltage flow across the body diode may be approximately 700 mV, and the flow conditions may be monitored securely. If the comparator circuit alternatively carries out the measurement of the power flow by comparing the voltage at the source or emitter terminal 1004 (e.g. cathode A) of the power MOSFET transistor 1001 with respect to a reference potential, the voltage at the source of the power transistor may be compared with a negative reference voltage Vref.

As the first comparator input terminal may be coupled to the drain or collector terminal 1005 of the rectifier transistor 1001, the comparator circuit may compare the drain potential of the rectifier transistor 1001 (e.g. the power MOSFET) and may switch the gate or base terminal 1006 with the potential or voltage provided by the charge control circuit 1012 (e.g. the charge pump may switch the power MOSFET on). The current value may be very small.

Due to the implementation of a comparator circuit carrying out a zero-detection measurement of the voltage at the drain or collector terminal, power losses may be reduced by switching on the rectifier transistor due to a reduced voltage drop across the rectifying device.

Figure 10B:
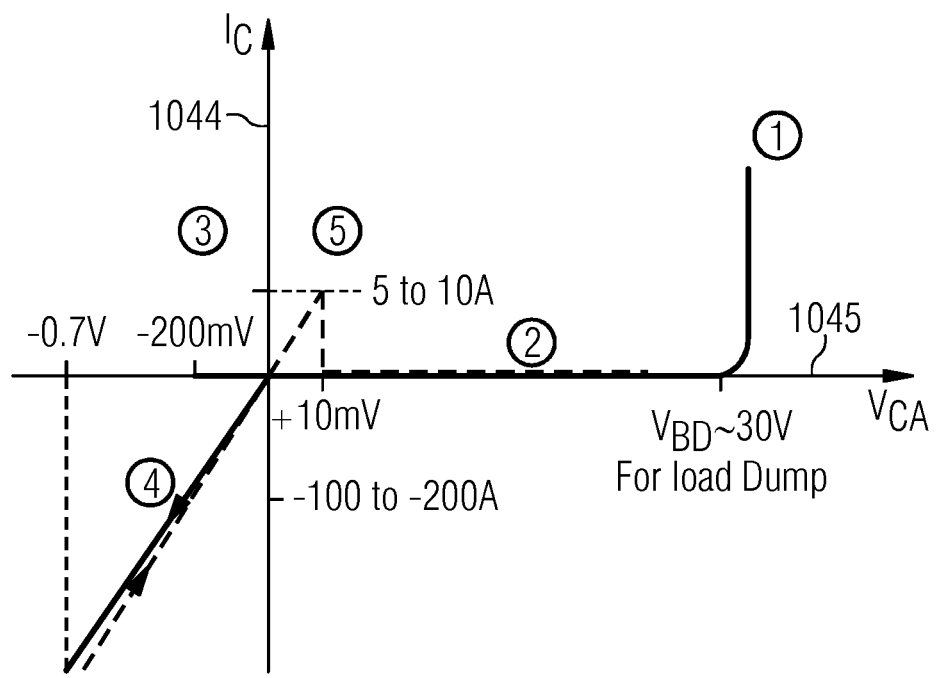
FIG. 10B shows a plot of current through a rectifier transistor with respect to voltage across a cathode and anode of a rectifying device.

FIG. 10B shows a plot of current in amperes (A) 1044, IC, with respect to voltage 1045 in volts (V) across the cathode and anode, VCA.

Time interval 1 shows the rectifier transistor (e.g. MOSFET) in active zener operation (break through or breakdown), for example. This current response may occur if a voltage larger than the breakdown voltage VBD may be applied across the cathode and anode, for example, due to load dump.

At time interval 2, VCA may be positive (e.g. during the positive half-wave). The rectifier transistor (e.g. MOSFET) may be in the transistor-off state, for example. For example, a gate-source voltage VGS may be zero, (e.g. VGS=0 V) and a gate-drain voltage VDS may be positive.

At time interval 3, the rectifier transistor may be triggered to an on-state. For example, VDS (or VCA) may be about −200 mV. VDS may be less negative than VF=0.7 of the power reverse diode 1013 but more negative than a first reference voltage Vref, thus triggering the rectifier control circuit to switch the rectifier transistor (e.g. MOSFET) to the on-state. A voltage provided to the gate terminal VGS may be about 5 V, for example.

At time interval 4, the rectifier transistor (e.g. MOSFET) may be in reverse on operation (e.g. VCA switches from a negative half-wave cycle towards a positive half-wave cycle). The current may fall and the operating point may move in the original direction. As the comparator circuit may have a hysteresis, a second reference value Vref may be near zero. e.g. +10 mV.

At time interval 5, when the reference voltage has been reached, the rectifier control circuit (e.g. the comparator circuit) may switch off the rectifier transistor (VGS =0V). However, a cross current may flow from 10 A, if the second diode has already been switched on.

More details and aspects are mentioned in connection with the embodiments described above or below (e.g. regarding the rectifying device, the rectifier transistor, the rectifier control circuit, the charge control circuit, the conduction management circuitry and the blocking management circuitry, the comparator circuit, the control transistor, the monolithic diode and the current source). The embodiment shown in FIG. 10A and described in FIG. 10B may comprise one or more optional additional features corresponding to one or more aspects mentioned in connection with the proposed concept or one or more embodiments described above (e.g. FIGS. 1 to 9) or below (e.g. FIG. 11A to FIG. 13).

Figure 11A:
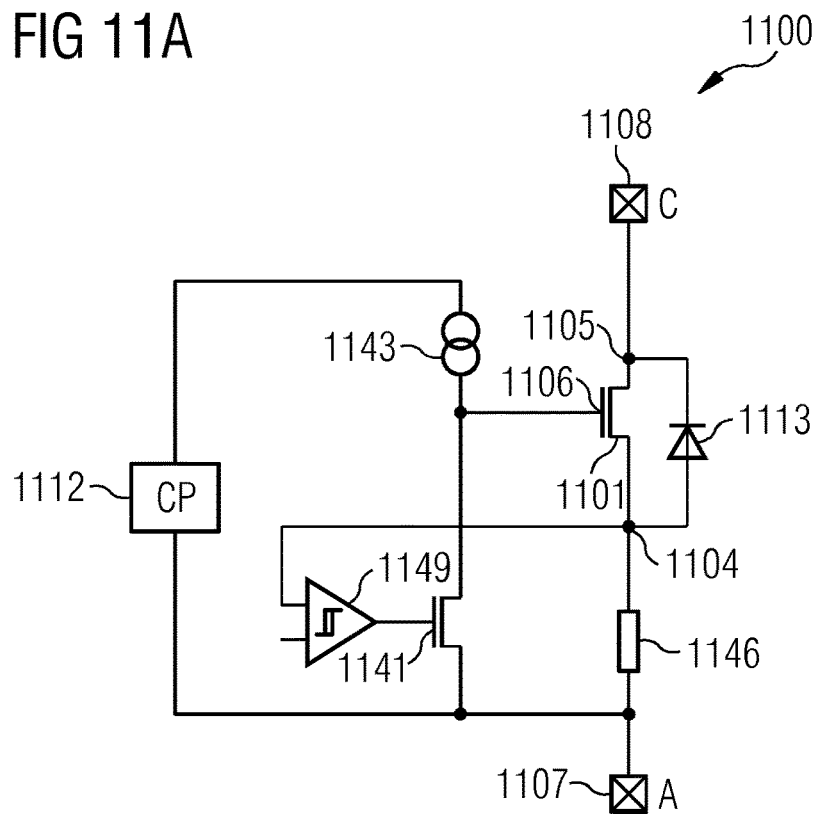
FIG. 11A shows a further rectifying device.

FIG. 11A shows a rectifying device 1100 according to an embodiment. The figure shows a circuit using a current measurement, for example. The rectifying device 1100 may be similar to the rectifying devices described with respect to FIGS. 1 to 10.

The rectifying device 1100 may include a rectifier transistor 1101, a switching control circuit 1149 and a charge control circuit 1112. The rectifying device 1000 may further include a control transistor 1141 and a current source 1143. The rectifying device 1000 may further include a monolithic diode 1113 and a monolithic sense resistor 1146.

An input terminal 1107 of the rectifying device 1100 may be coupled to the sense resistor 1146. The sense resistor 1146 may be coupled between the input terminal 1107 of the rectifying device 1100 and the source or emitter terminal 1104 of the rectifier transistor 1101, for example. The input terminal 1107 of the rectifying device may be coupled to a first sense resistor terminal, for example. A second sense resistor terminal may be coupled to the source or emitter terminal 1104 of the rectifier transistor 1101, for example.

The input terminal 1107 may be coupled to the control transistor 1041, for example. The input terminal 1107 and the first sense resistor terminal may be coupled to a first control transistor terminal, for example.

The input terminal 1107, the first sense resistor and the first control transistor terminal may be coupled to the charge control circuit, for example. The input terminal 1107, the first sense resistor terminal and the first control transistor terminal may be coupled to a first charge control circuit terminal, for example.

A second control transistor terminal may be coupled to the current source 1143, for example. The second control transistor terminal may be coupled to a first current source terminal, for example. The second control transistor terminal and the first current source terminal may be coupled to the gate or base terminal 1106 of the rectifier transistor 1001, for example.

The second current source terminal may be coupled to the charge control circuit 1112, for example. The second current source terminal may be coupled to a second charge control circuit terminal, for example.

The control transistor 1141 and the current source 1143 may be coupled in series between the first charge control circuit terminal and the second charge control circuit terminal of the charge control circuit, for example.

The switching control circuit 1149 may include a comparator circuit, such as a voltage or current comparator, for example. A first comparator input terminal may provide a first reference value to the comparator circuit. A second comparator input terminal may be coupled to a node between the sense resistor 1146 and the rectifier transistor 1106, for example. The second comparator input terminal may be coupled to a node between the second sense resistor terminal and the source or emitter terminal 1104 of the rectifier transistor 1106, for example. A comparator output terminal may be coupled to the control transistor gate or base terminal, for example.

The source or emitter terminal 1104 of the rectifier transistor 1101 and the second sense resistor terminal may be coupled to the diode input terminal of the monolithic diode 1113, for example. The diode output terminal may be coupled to the drain or collector terminal 1105 of the rectifier transistor 1101, for example.

The drain or collector terminal 1105 of the rectifier transistor 1101 may be coupled to an output terminal 1108 of the rectifying device 1100, for example.

The rectifier control circuit may be configured to switch the rectifier transistor 1101 to a transistor on-state or to a transistor off-state based on a control signal provided by the comparator circuit, for example. For example, the switching control circuit 1149 may be configured to generate the control signal by comparing a reference value with a voltage or current signal based on a voltage or current signal between the sense resistor and the source or emitter terminal 1104.

For example, the switching control circuit 1149 may carry out the measurement of the power flow by comparing the voltage drop at the sense resistor 1046 with a reference voltage Vref. As the rectifier transistor 1104 (e.g. a power MOSFET) may be low ohmic, the potential drop at the sense resistor may be very small, e.g. a few mV. As the source or emitter terminal 1104 of transistor 1101 may be connected to the first comparator input terminal, the comparator circuit may compare the source potential of the rectifier transistor 1104 (e.g. a power MOSFET) and may switch off the voltage applied to the gate (e.g. source potential off) if the current in the rectifier transistor 1104 exceeds the given current level IAC=VREF/Rs, where Rs is the resistance of the sense resistor 1146. As the resistance of the sense resistor may be very small, e.g. about 0.1 mΩ, VREF may be about 1 mV, for example.

Figure 11B:
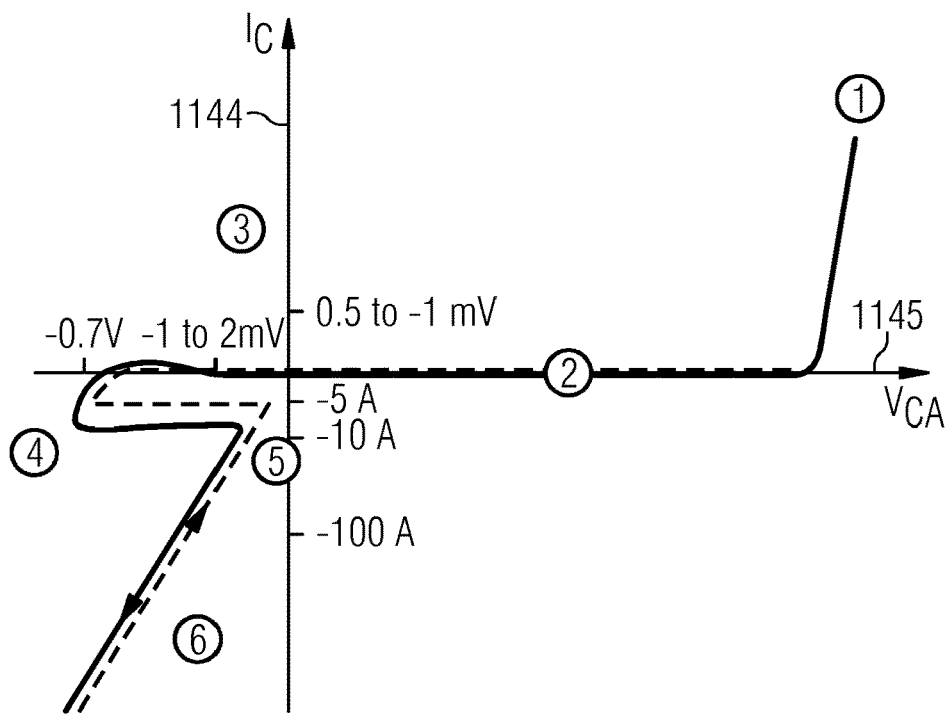
FIG. 11B shows a plot of current flow through a rectifier transistor with respect to voltage across a cathode and anode of a rectifying device.

FIG. 11B shows a plot of current in amperes (A) 1144, IC, with respect to voltage 1145 in volts (V) across the cathode and anode, VCA.

Time interval 1 shows the rectifier transistor (e.g. MOSFET) in active zener operation (break through), for example. This current response may occur if a voltage larger than the breakdown voltage VBD may be applied across the cathode and anode, for example, due to load dump.

At time interval 2, the rectifier transistor (e.g. MOSFET) may be in the transistor off-state, for example. For example, a gate-source voltage VGS may be zero, (e.g. VGS=0 V) and a gate-drain voltage VDS may be positive.

At time interval 3, the rectifier transistor (e.g. MOSFET) may be in a transistor off-state. VGS may be zero (e.g. VGS=0 V), and VDS may be negative and less negative than VF=0.7 of the power reverse diode 1113.

At time interval 4, the rectifier transistor (e.g. MOSFET) may be in a transistor off-state. VGS may be zero (e.g. VGS=0 V), and VDS may be negative and approximately equal to VF=0.7. The diode 1113 may conduct.

At time interval 5, if the current threshold is reached, the rectifier transistor (e.g. MOSFET) may be switched to the transistor on-state. For example, VGS may be approximately equal to 5V. VDS may be equal to a product of the current between the anode and cathode IAC and the on resistance of the rectifier transistor RDSON, e.g. VDS=IAC×RDSON.

At time interval 6, the rectifier transistor (e.g. MOSFET) may be in reverse on operation (e.g. VCA switches from a negative half-wave cycle towards a positive half-wave cycle).

If the comparator circuit has no hysteresis, the rectifier transistor 1101 may be switched off at the same current value as if the current level falls. Installation of hysteresis may be implemented to reduce unwanted fluctuations at the switching point.

More details and aspects are mentioned in connection with the embodiments described above or below (e.g. regarding the rectifying device, the rectifier transistor, the rectifier control circuit, the switching control circuit, the charge control circuit, the conduction management circuitry and the blocking management circuitry, the comparator circuit, the control transistor, the monolithic diode and the current source). The embodiment shown in FIG. 11A and described in FIG. 11B may comprise one or more optional additional features corresponding to one or more aspects mentioned in connection with the proposed concept or one or more embodiments described above (e.g. FIGS. 1 to 10B) or below (e.g. FIG. 12A to FIG. 13).

Figure 12A:
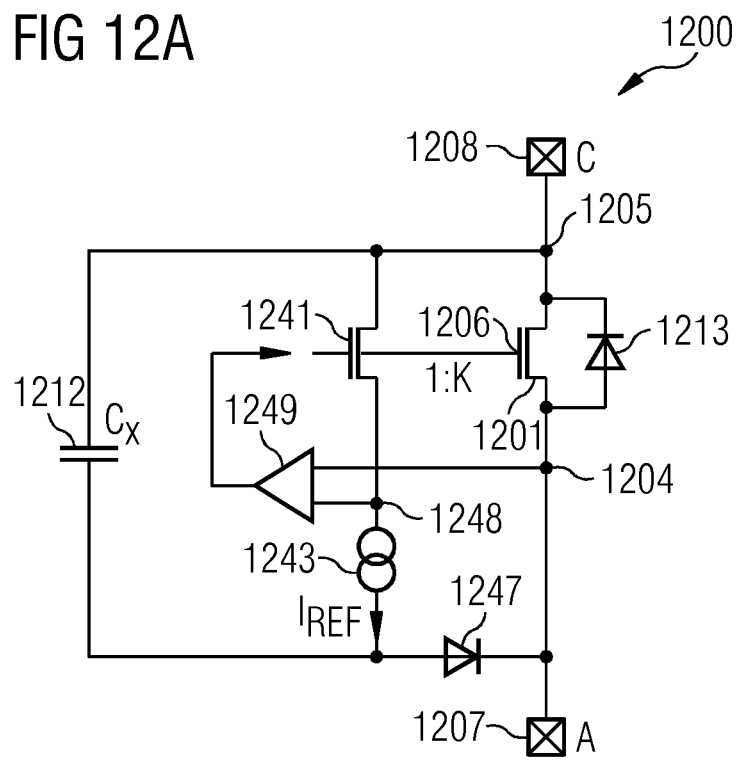
FIG. 12A shows a further rectifying device.

FIG. 12A shows a rectifying device 1200 according to an embodiment. The figure shows a circuit which compares drain-source voltages (VDS), for example. The rectifying device 1200 may be similar to the rectifying devices described with respect to FIGS. 1 to 11.

The rectifying device 1200 may include a rectifier transistor 1201, a switching control circuit 1249 and a charge control circuit 1212. The rectifying device 1200 may further include a sense transistor 1241 and a current source 1243. The rectifying device 1000 may further include a monolithic diode 1213 and a further diode 1247.

An input terminal 1207 of the rectifying device 1200 may be coupled to the source or emitter terminal 1204 of the rectifier transistor 1001, for example. The input terminal 1207 may be coupled to the further diode 1247, for example. A further diode output terminal may be coupled to a node between the input terminal 1207 and the source or emitter terminal 1204 of the rectifier transistor 1001, for example.

The further diode input terminal may be coupled to the current source 1243, for example. The further diode input terminal may be coupled to a first current source terminal, for example. The first current source terminal and the further diode input terminal may be coupled to the charge control circuit 1212, for example. The first current source terminal and the further diode input terminal may be coupled to a first charge control circuit terminal, for example.

A second current source terminal may be coupled to the sense transistor 1241, for example. The second current source terminal may be coupled to a first sense transistor terminal 1248, for example. The second current source terminal and the first sense transistor terminal 1248 may be coupled to the switching control circuit 1249, for example.

The switching control circuit 1249 may include a comparator circuit, such as a voltage comparator or current comparator, for example. A first comparator input terminal may be coupled to the first sense transistor terminal 1248, e.g. to the sense transistor source or emitter terminal 1248, for example, or to a node between the current source 1243 and the sense transistor 124, for example. The first comparator input terminal may be coupled to a node between the second current source terminal and the first sense transistor terminal 1248, for example. A second comparator input terminal may be coupled to the source or emitter terminal 1204 of the rectifier transistor 1201, for example. A comparator output terminal may be coupled to the sense transistor gate or base terminal, and to the gate or base terminal 1206 of the rectifier transistor 1201, for example.

The second sense transistor terminal may be coupled to the charge control circuit 1212, for example. The second sense transistor terminal may be coupled to a second charge control circuit terminal, for example. The sense transistor 1241 and the current source 1243 may be coupled in series between the second charge control circuit terminal and the first charge control circuit terminal of the charge control circuit 1212, for example. The second sense transistor terminal may also be coupled to the drain or collector terminal 1205 of the rectifier transistor 1201, for example.

The source or emitter terminal 1204 of the rectifier transistor 1201 may be coupled to a diode input terminal of the monolithic diode 1213, for example. A diode output terminal may be coupled to the drain or collector terminal 1205 of the rectifier transistor 1001, for example.

The drain or collector terminal 1205 of the rectifier transistor 1201 may be coupled to an output terminal 1208 of the rectifying device 1200, for example.

The switching control circuit 1249 may be configured to generate the control signal by comparing a voltage or current signal present at the sense transistor source or emitter terminal 1248 with a voltage or current signal present at the rectifier transistor source or emitter terminal 1204. The rectifier control circuit may be configured to switch the rectifier transistor 1201 between the transistor on-state and the transistor off-state based on the control signal.

The comparator circuit may carry out the measurement of the power flow by reducing the current level proportionally to the power in the rectifier transistor 1101 (e.g. the power MOSFET 1201 to the sense transistor 1241). For example, the number of cells in the sense transistor 1241 compared to the number of cells in the rectifier transistor may be expressed in terms of the sense ratio, e.g. 1:K. K may represent an integer value, for example.

Figure 12B:
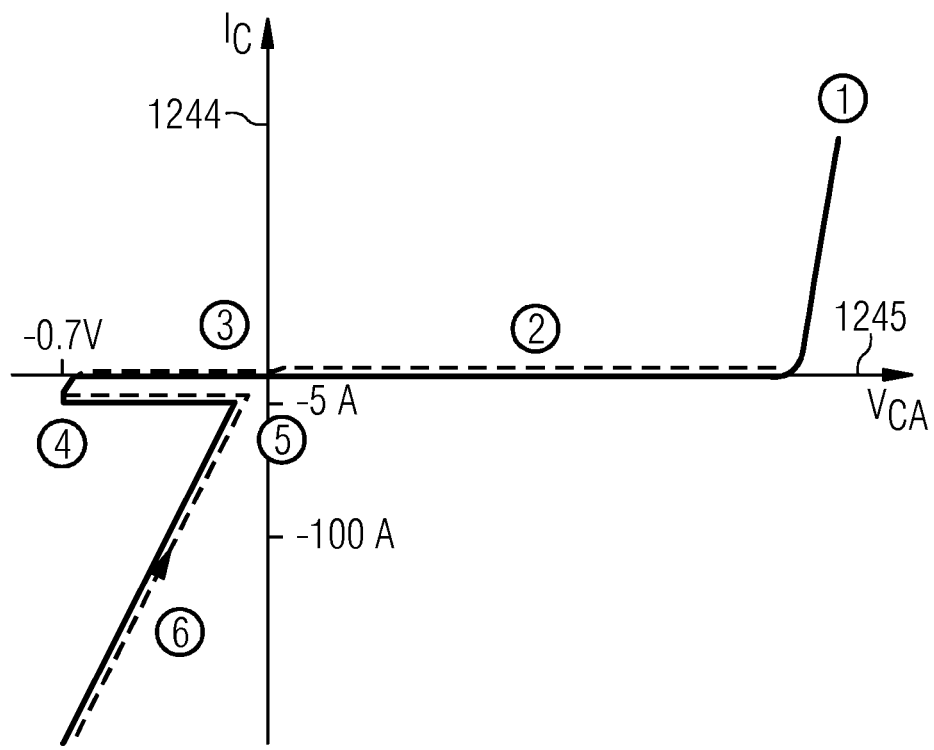
FIG. 12B shows a plot of current flow through a rectifier transistor with respect to voltage across a cathode and anode of a rectifying device.

For example, the reduced current may be compared with the current sink reference Iref. The source or emitter terminal 1204 of the rectifier transistor may be coupled to the first comparator input terminal. As the sense transistor source or emitter terminal 1248 may be coupled to the second comparator input terminal, which may also be coupled to the current source or sink, the comparator circuit may compare the source potentials of both the rectifier transistor 1101 and the sense transistor 1241 and may switch off the voltage applied to the gate (e.g. source potential off) if the current in the sense transistor exceeds the given reference current level, IAC=Irefx(K+1), for example , FIG. 12B shows a plot of current in amperes (A) 1244, IC, with respect to voltage 1245 in volts (V) across the cathode and anode, VCA.

Time interval 1 shows the rectifier transistor (e.g. MOSFET) in active zener operation (break through), for example.

At time interval 2, the rectifier transistor (e.g. MOSFET) may be in a transistor off-state, for example. For example, a gate-source voltage VGS may be zero, (e.g. VGS=0 V) and a gate-drain voltage VDS may be positive.

At time interval 3, the rectifier transistor (e.g. MOSFET) may be in a transistor off-state. VGS may be zero (e.g. VGS=0 V), and VDS may be negative and less negative than VF=0.7 of the power reverse diode 1213.

At time interval 4, the rectifier transistor (e.g. MOSFET) may be in a transistor off-state. VGS may be zero (e.g. VGS=0 V), and VDS may be negative and approximately equal to VF=0.7. The diode 1213 may conduct.

At time interval 5, if the current threshold is reached, the rectifier transistor 1101 (e.g. MOSFET) may be switched on. For example, VGS may be approximately equal to 5V. For example, the drain-source voltage VDS may be approximately equal to IAC×RDSON, where RDSON is the on resistance of the rectifier transistor.

At time interval 6, the rectifier transistor (e.g. MOSFET) may be in reverse ON operation, for example when the voltage VCA goes from negative value to positive.

If the comparator circuit has no hysteresis, the rectifier transistor 1101 may be switched off at the same current value if the current level falls. Implementation of a hysteresis may reduce unwanted fluctuations at the switching point, for example.

More details and aspects are mentioned in connection with the embodiments described above or below (e.g. regarding the rectifying device, the rectifier transistor, the rectifier control circuit, the switching control circuit, the charge control circuit, the conduction management circuitry and the blocking management circuitry, the comparator circuit, the sense transistor, the monolithic diode and the current source). The embodiment shown in FIG. 12A and described in FIG. 12B may comprise one or more optional additional features corresponding to one or more aspects mentioned in connection with the proposed concept or one or more embodiments described above (e.g. FIGS. 1 to 11B) or below (e.g. FIG. 13).

Various embodiments relate to an active rectifier with a MOSFET and two terminals. Various embodiments relate to a Copper-Silicon-Copper (Cu—Si—Cu) active rectifier with a MOSFET and two terminals. The embodiments include an application-optimized technology and a circuit arrangement which provides a fully integrated (monolithic) product, which independently achieves in a 2 pin housing the rectification of alternating signals with low losses, for example.

In various embodiments, a MOSFET solution may be implemented in a housing with two connections, e.g. in a press-fit housing, and may be easily used by consumers. Electrical circuit improvements may be achieved with the MOSFET, and $CO_2$ consumption may be reduced. Lower costs may also be achieve.

Various embodiments relate to a rectifying device which may include a monolithic power transistor with small on resistance Ron and low gate charge. The rectifying device may include if necessary, a monolithic diode implemented in parallel to a power transistor. The rectifying device may include a monolithic analog component with high integrations density and low current consumption at high temperatures (250° C.). The rectifying device may include a monolithic capacitor or other storage element. The rectifying device may include a solderable front and back side with respectively at least one contact. Various embodiments relate to a CuSiCu-Copper-Silicon-Copper rectifier arrangement.

Various embodiments relate to an integrated circuit (IC) which may include a charge control block for managing the energy saved during a blocking phase, for example. The IC further may include a zero-crossing control to detect a conducting and blocking phase using a current and/or voltage sensor, for example. The IC may further include a circuit breaker, for example. The IC may further include a conduction management circuit to switch on a circuit breaker and a blocking management circuit to switch off the circuit breaker, for example.

Various embodiments relate to the installation of a MOSFET solution in a housing with two connections, e.g. like a press-fit housing, for example. The voltage drop may be reduced from 1 V (pn diodes) to 0.2 V, for example. A press-fit housing may exhibit good thermal properties and may also be cost effective to implement.

Although high efficiency diodes (HED) may be used for rectification, certain trade-offs may be observed, for example. For example, the forward voltage Vf of the HED may be reduced through the Schottky effect or metal oxide semiconductor (MOS) gated diode effect, for example. For example, a reduced forward voltage, e.g. (Vf from 0.7 V) such as a reduction of about 30% with respect to the p-n diodes may be possible. However, higher leakage current and in the case of Schottky diodes, reduced temperature strength (at less than 200° C.) may be experienced compared to standard p-n Diodes which have temperature limits of up to 230° C. and high temperature diodes which have temperature limits of up to 250° C., for example.

By using MOSFETs for rectification, one MOSFET module per phase may be used to accommodate the MOSFETs and their control. The achievable forward voltage may be significantly lower and values of about 0.2V may be achieved. The cost of the manufacturing and connections may be high, for example. Load dump requirements which may reach up to 2500 W for 400 ms and which may require cooling of the MOSFETS and may affect the power distribution (filamentation) in MOSFET may be addressed by the various embodiments and using a press-fit housing, for example.

Various embodiments described herein may relate to an efficient rectifier which may be applied in many scenarios, such as in large current (e.g. greater than 100 A) rectifier applications. An application may be in a generator of vehicles where currents to be rectified may be large, e.g. up to 250 A total current. Rectifier losses, which make up about 40% of the total losses (in addition to iron and copper losses) may be reduced and environmental pollution, e.g. petrol consumption/$CO_2$ emissions may be reduced. Through the reduction of rectifier losses by various embodiments described herein, the thermal properties of the generator may also be improved. For example, fan blades of the generator be made smaller, and therefore noise and ventilation noises may be reduced.

Figure 13:
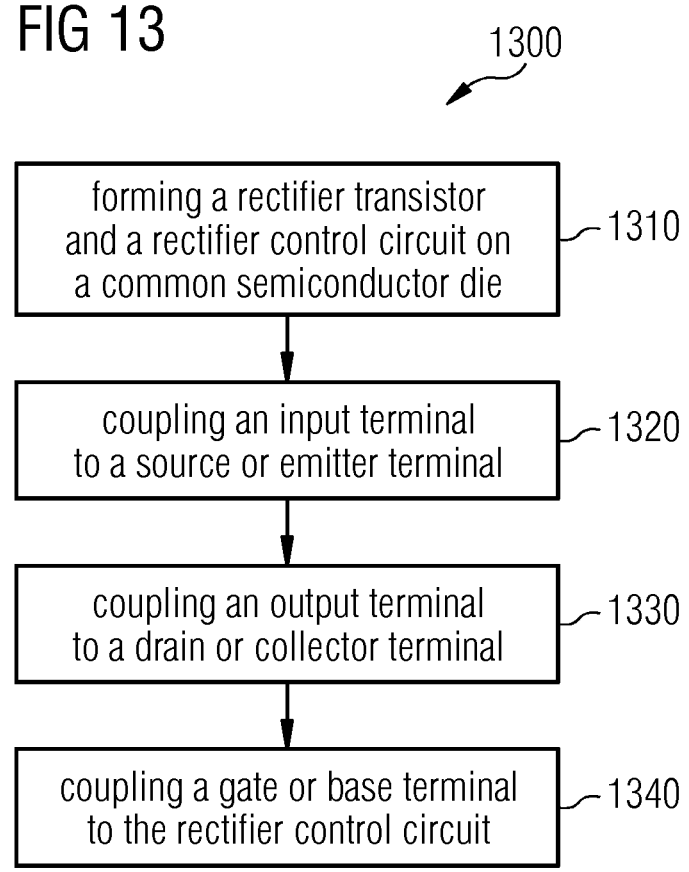
FIG. 13 shows a flow chart of a method for forming a rectifying device.

FIG. 13 shows a flow chart of a method 1300 for forming a rectifying device.

The method includes forming 1310 a rectifier transistor and a rectifier control circuit on a common semiconductor die.

The method further includes coupling 1320 an input terminal of the rectifying device to a source or emitter terminal of the rectifier transistor.

The method further includes coupling 1330 an output terminal of the rectifying device to a drain or collector terminal of the rectifier transistor.

The method further includes coupling 1340 a gate or base terminal of the rectifier transistor to the rectifier control circuit.

Due to the formation of a rectifier control circuit and a rectifier transistor on a common semiconductor die, no further external control circuit may be needed to operate the rectifying device, for example. By using a rectifier transistor for rectifying an oscillating signal, the power loss of the rectifying device may be reduced, for example. Further, a monolithic integration of the rectifier transistor may result in reduced costs, for example.

The method may further include connecting a first externally accessible terminal of a housing to the input terminal of the rectifying device and a second externally accessible terminal of the housing to the output terminal of the rectifying device.

Due to the implementation of a rectifying device with only two externally accessible terminals in a two-terminal housing, thermal properties may be improved and power losses may be reduced, for example.

More details and aspects are mentioned in connection with the embodiments described above or below (e.g. regarding the housing, the rectifying device, the rectifier transistor, the rectifier control circuit, and the common semiconductor die). The embodiment shown in FIG. 13 may comprise one or more optional additional features corresponding to one or more aspects mentioned in connection with the proposed concept or one or more embodiments described above (e.g. FIGS. 1 to 12B) or below.

Figure 14:
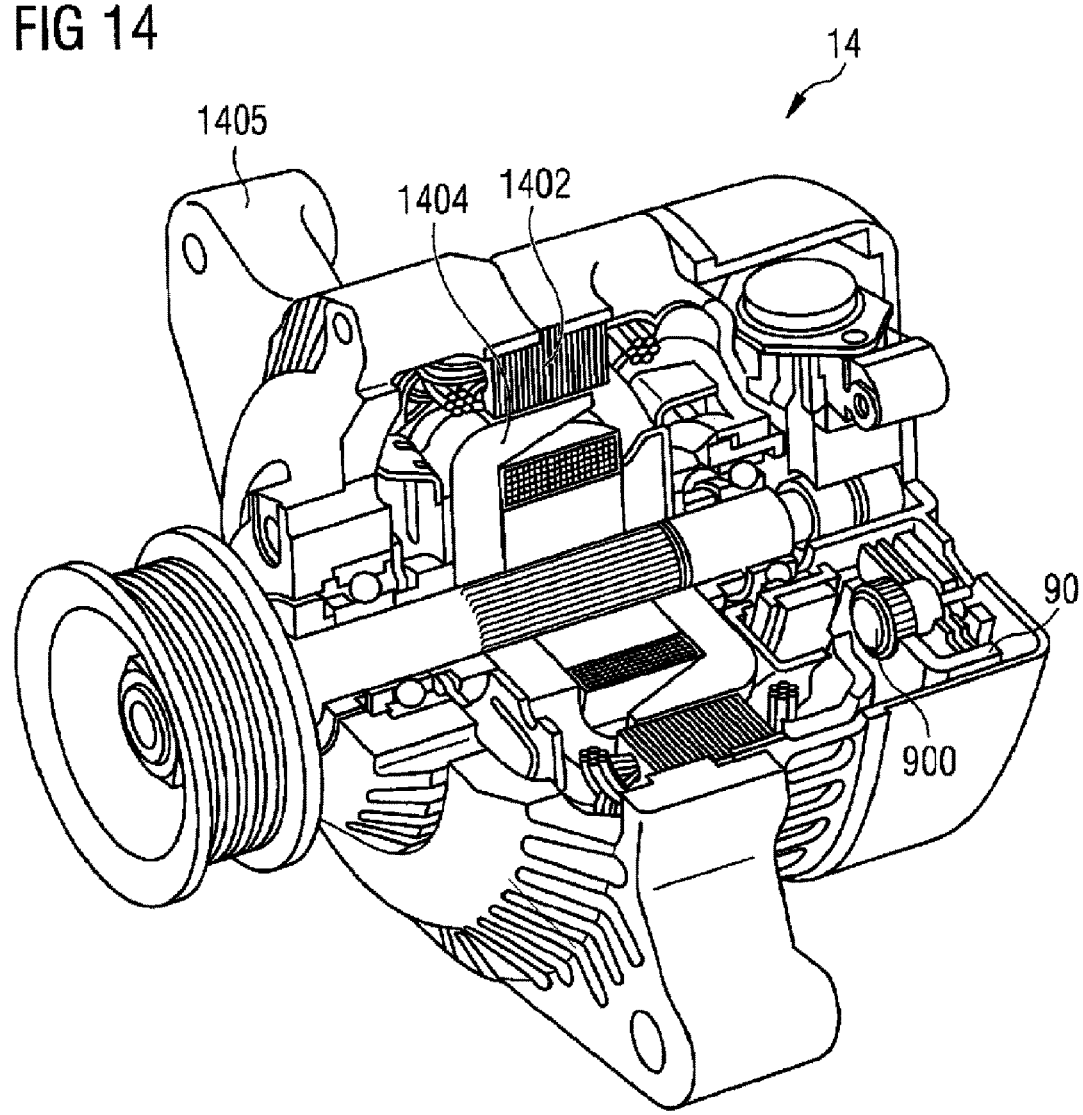
FIG. 14 shows an automotive electric generator.

FIG. 14 shows schematically an electric generator or alternator 14 that may be used with automotive engines. The electric generator 14 comprises a housing 1405, a stator 1402 and a rotor 1404. Available electric generators comprise a rectifier 90. The rectifier 90 conventionally comprises a plurality of diodes within a press-fit package fitted into the rectifier 90. According to the present disclosure the rectifier diode is replaced by the rectifying device 900 in a press-fit package as described above.

Figure 15:
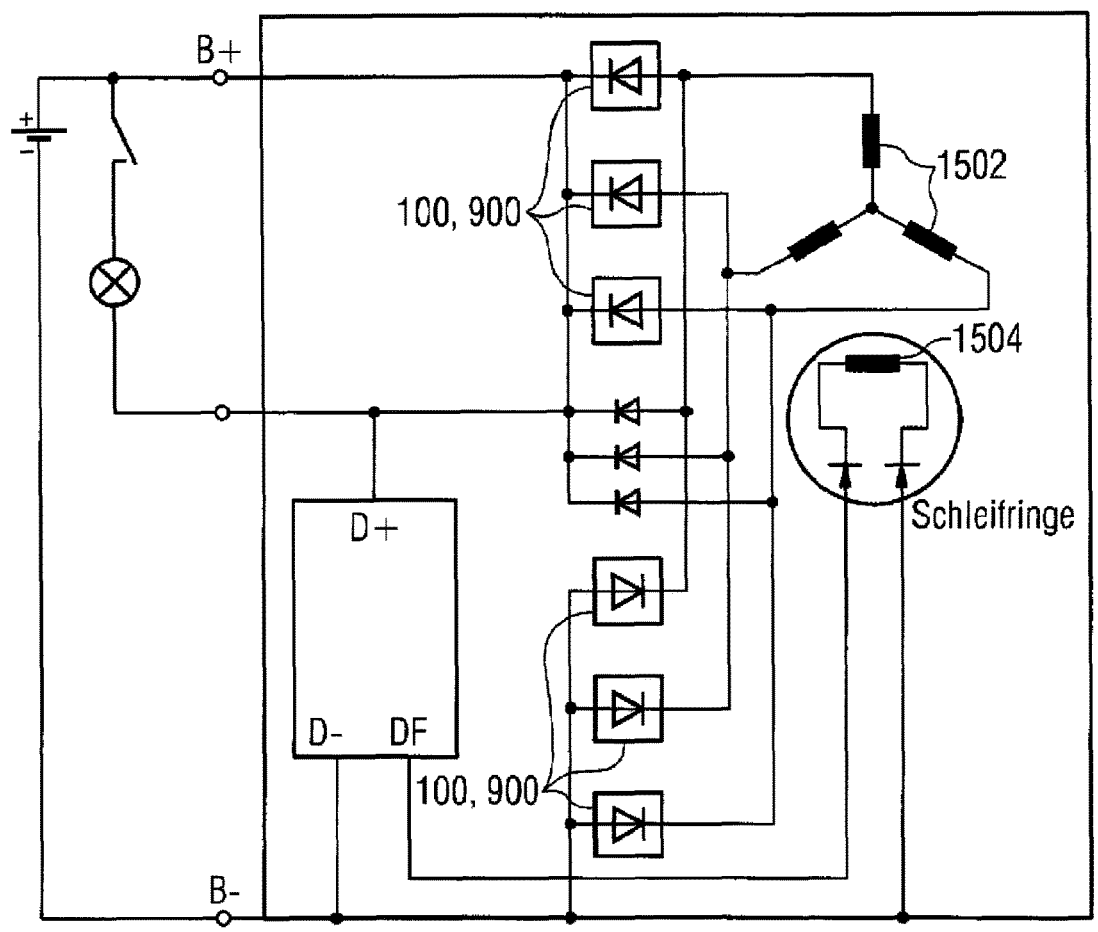
FIG. 15 shows a circuit for an automotive generator.

FIG. 15 shows a circuit for an automotive generator, as for example shown in FIG. 14. Three stator elements 1502 are connected via six rectifying elements to the output. Rectifying devices 100, 900 as described above are used here instead of conventionally used diodes. In the case shown in total six rectifying devices may be used, but different numbers are possible. As the entire rectifying device may be implemented on a single semiconductor die or chip, the chip can be placed in two positions in the press-fit package. In a first position the source terminal is electrically connected to the stator. In a second position, the chip may be flipped and the drain terminal is electrically connected to the stator. No changes to the press-fit package are required and the chip can be mounted in both positions, similar to a conventional diode. However, the rectifying device of the present disclosure has a considerably higher efficiency and lower losses.

The above disclosure has been described with respect to a Press-Fit Package for an automotive engine alternator, where the use of the described rectifying devise has particular advantages. However, the rectifying device may be used in other applications, for example in low Power SMPS and/or free-wheeling diodes of a DC/DC Buck converter. Other examples for application include but are not limited to rectifier for two wheelers such as motorbikes or e-Bikes or as bypass diodes for solar panels.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A rectifying device, comprising:
    a power transistor having a source terminal connected to one of a first terminal and a second terminal of the rectifying device, a drain terminal connected to the other one of the first terminal and the second terminal of the rectifying device and a gate;
    a gate control circuit operable to control a gate voltage at the gate of the power transistor based on at least one parameter relating to at least one of a voltage and a current between the first terminal and the second terminal; and
    a capacitor structure,
    wherein the power transistor, the gate control circuit and the capacitor structure are arranged in a single semiconductor die.
2. The rectifying device of claim 1, wherein the power transistor is a MOSFET.
3. The rectifying device of claim 1, wherein the power transistor is a vertical transistor, wherein the source terminal is arranged at a first side of the semiconductor die and the drain terminal is arranged at a second side of the semiconductor die.
4. The rectifying device of claim 1, wherein the power transistor comprises at least one gate trench comprising an insulation and a gate electrode.
5. The rectifying device of claim 1, wherein the capacitor structure comprises at least one capacitor trench in the semiconductor die.
6. The rectifying device of claim 5, wherein the at least one capacitor trench extends vertically from a front side of the semiconductor die into a substrate region of the semiconductor die.
7. The rectifying device of claim 1, wherein the capacitor structure has a capacity of 10 nF to 500 nF.
8. The rectifying device of claim 1, wherein the gate control circuit comprises one or more p-type MOS transistors and one or more n-type MOS transistors.
9. The rectifying device of claim 1, wherein the gate control circuit is connected to the first terminal and to the second terminal and has no additional external connections.
10. The rectifying device of claim 1, wherein the gate control circuit is configured turn the power transistor on using a voltage that is stored across the capacitor structure during a blocking state of the rectifying device.
11. A press-fit rectifying device, comprising:
    a semiconductor die; and
    a two-terminal press-fit package comprising a first terminal and a second terminal, wherein the semiconductor die comprises:
    a power transistor having a source terminal connected one of the first terminal and the second terminal, a drain terminal connected to the other one of the first terminal and the second terminal and a gate; and
    a gate control circuit operable to control a gate voltage at the gate of the power transistor based on at least one parameter relating to at least one of a voltage and a current between the first terminal and the second terminal.
12. The press-fit rectifying device of claim 11, wherein the semiconductor die further comprises a capacitor structure, and wherein the semiconductor die is arranged as a single semiconductor die in the press-fit package.
13. The press-fit rectifying device of claim 11, wherein the press-fit package comprises a cup and a nailhead, and wherein the semiconductor die is arranged between the cup and the nailhead with the source terminal facing the cup.
14. The press-fit rectifying device of claim 11, wherein the press-fit package comprises a cup and a nailhead, and wherein the semiconductor die is arranged between the cup and the nailhead with the drain terminal facing the cup.
15. An electric generator for a motor vehicle, the electric generator comprising at least one rectifying device, the at least one rectifying device comprising:
    a power transistor having a source terminal connected to one of a first terminal and a second terminal of the at least one rectifying device, a drain terminal connected to the other one of the first terminal and the second terminal of the at least one rectifying device and a gate;
    a gate control circuit operable to control a gate voltage at the gate of the power transistor based on at least one parameter relating to at least one of a voltage and a current between the first terminal and the second terminal; and
    a capacitor structure, wherein the power transistor, the gate control circuit and the capacitor structure are arranged in a single semiconductor die.

16. The electric generator of claim 15, wherein the at least one rectifying device is configured to electrically connect the source terminal to a stator of the electric generator in a first position and to electrically connect the drain terminal to the stator in a second position.

17. The electric generator of claim 15, wherein the at least one rectifying device comprises at least one first rectifying device arranged with the source terminal connected to a stator of the electric generator and at least one second rectifying device arranged with the drain terminal facing connected to the stator.

18. An electric generator for a motor vehicle, the electric generator comprising at least one press-fit rectifying device, the at least one rectifying device comprising:
   a semiconductor die; and
   a two-terminal press-fit package comprising a first terminal and a second terminal,
   wherein the semiconductor die comprises:
      a power transistor having a source terminal connected one of the first terminal and the second terminal of the at least one rectifying device, a drain terminal connected to the other one of the first terminal and the second terminal of the at least one rectifying device and a gate; and
      a gate control circuit operable to control a gate voltage at the gate of the power transistor based on at least one parameter relating to at least one of a voltage and a current between the first terminal and the second terminal.

19. The electric generator of claim 18, wherein the at least one rectifying device is configured to electcially connect the source terminal to a stator of the electric generator in a first position and to electrcially connect the drain terminal to the stator in a second position.

20. The electric generator of claim 18, wherein the at least one rectifying device comprises at least one first rectifying device arranged with the source terminal connected to a stator of the electric generator and at least one second rectifying device arranged with the drain terminal facing connected to the stator.

* * * * *

UNITED STATES PATENT AND TRADEMARK OFFICE
CERTIFICATE OF CORRECTION

PATENT NO. : 10,291,108 B2  
APPLICATION NO. : 14/849655  
DATED : May 14, 2019  
INVENTOR(S) : D. Ahlers et al.

Page 1 of 1

It is certified that error appears in the above-identified patent and that said Letters Patent is hereby corrected as shown below:

In the Claims

Column 28, Line 24 (Claim 10, Line 2) please change "configured turn" to -- configured to turn --
Column 28, Line 33 (Claim 11, Line 6) please change "connected one" to -- connected to one --
Column 29, Lines 21, 22 (Claim 18, Lines 8, 9) please change "connected one" to -- connected to one --
Column 30, Line 11 (Claim 19, Line 2) please change "to electcially" to -- to electrically --
Column 30, Line 13 (Claim 19, Line 4) please change "to electrcially" to -- to electrically --

Signed and Sealed this  
Thirtieth Day of July, 2019

Andrei Iancu  
*Director of the United States Patent and Trademark Office*